US 9,082,744 B2

United States Patent
Boday et al.

(10) Patent No.: US 9,082,744 B2
(45) Date of Patent: Jul. 14, 2015

(54) METHOD FOR ALIGNING CARBON NANOTUBES CONTAINING MAGNETIC NANOPARTICLES IN A THERMOSETTING POLYMER USING A MAGNETIC FIELD

(71) Applicant: International Business Machines Corporation, Armonk, NY (US)

(72) Inventors: Dylan J. Boday, Tucson, AZ (US); Joseph Kuczynski, Rochester, MN (US); Robert E. Meyer, III, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/936,369

(22) Filed: Jul. 8, 2013

(65) Prior Publication Data

US 2015/0008592 A1    Jan. 8, 2015

(51) Int. Cl.
| | | |
|---|---|---|
| *H01L 23/373* | (2006.01) | |
| *B29C 70/62* | (2006.01) | |
| *H01L 25/065* | (2006.01) | |
| *B29K 105/16* | (2006.01) | |

(52) U.S. Cl.
CPC .............. *H01L 23/373* (2013.01); *B29C 70/62* (2013.01); *H01L 25/0657* (2013.01); *B29K 2105/167* (2013.01)

(58) Field of Classification Search
CPC ............................ H01L 25/0657; B29C 70/62
USPC .................................................. 264/427, 429
See application file for complete search history.

(56) References Cited

U.S. PATENT DOCUMENTS

| | | | |
|---|---|---|---|
| 4,882,399 A | 11/1989 | Tesoro et al. | |
| 5,506,753 A | 4/1996 | Bertin et al. | |
| 5,912,282 A | 6/1999 | Iyer et al. | |
| 6,407,922 B1 | 6/2002 | Eckblad et al. | |
| 6,537,515 B1 | 3/2003 | Baker et al. | |

(Continued)

FOREIGN PATENT DOCUMENTS

| | | |
|---|---|---|
| JP | 2002273741 A | 9/2002 |
| JP | 2006193836 A | 7/2006 |

(Continued)

OTHER PUBLICATIONS

Tong, Tao et al., "Dense Vertically Aligned Multiwalled Carbon Nanotube Arrays as Thermal Interface Materials", IEEE Transactions on Components and Packaging Technologies, vol. 30, No. 1, Mar. 2007, pp. 92-100.

(Continued)

*Primary Examiner* — Wael Fahmy
*Assistant Examiner* — Younes Boulghassoul
(74) *Attorney, Agent, or Firm* — Stachler Intellectual Property LLC

(57) ABSTRACT

The chip stack of semiconductor chips with enhanced cooling apparatus includes a first chip with circuitry on a first side and a second chip electrically and mechanically coupled to the first chip by a grid of connectors. The chip stack further includes a thermal interface material pad between the first chip and the second chip. The thermal interface material pad comprises a plurality of nanotubes containing a magnetic material, aligned parallel to mating surfaces of the first chip and the second chip, wherein a hydrophobic tail of oleic acid is wrapped around each one of the plurality of nanotubes and a hydrophilic acid head of the oleic acid is attached to the magnetic material.

7 Claims, 8 Drawing Sheets

(56) References Cited

U.S. PATENT DOCUMENTS

| | | | |
|---|---|---|---|
| 6,721,796 | B1 | 4/2004 | Wong et al. |
| 6,730,731 | B2 | 5/2004 | Tobita et al. |
| 6,764,759 | B2 | 7/2004 | Duvall et al. |
| 6,790,425 | B1 | 9/2004 | Smalley et al. |
| 6,891,724 | B2 | 5/2005 | De Lorenzo et al. |
| 6,965,513 | B2 | 11/2005 | Montgomery et al. |
| 6,987,302 | B1 | 1/2006 | Chen et al. |
| 7,189,778 | B2 | 3/2007 | Tobita et al. |
| 7,238,415 | B2 | 7/2007 | Rodriguez et al. |
| 7,270,795 | B2 | 9/2007 | Kawakami et al. |
| 7,387,747 | B2 | 6/2008 | Taya et al. |
| 7,550,129 | B2 | 6/2009 | Baker et al. |
| 7,592,389 | B2 | 9/2009 | Baker et al. |
| 7,649,308 | B2 | 1/2010 | Lee et al. |
| 7,658,865 | B2 | 2/2010 | Lu |
| 7,674,410 | B2 | 3/2010 | Huang et al. |
| 7,784,531 | B1 | 8/2010 | Li et al. |
| 7,803,262 | B2 * | 9/2010 | Haik et al. .............. 204/557 |
| 7,847,394 | B2 | 12/2010 | Dubin et al. |
| 7,863,366 | B2 | 1/2011 | Dupire et al. |
| 8,039,953 | B2 | 10/2011 | Dangelo |
| 8,048,794 | B2 | 11/2011 | Knickerbocker |
| 8,106,510 | B2 | 1/2012 | Altman et al. |
| 2002/0054849 | A1 | 5/2002 | Baker et al. |
| 2004/0150100 | A1 | 8/2004 | Dubin et al. |
| 2005/0061496 | A1 | 3/2005 | Matabayas, Jr. |
| 2005/0239948 | A1 | 10/2005 | Haik et al. |
| 2005/0269726 | A1 * | 12/2005 | Matabayas .............. 264/104 |
| 2006/0001013 | A1 | 1/2006 | Dupire et al. |
| 2006/0211327 | A1 | 9/2006 | Lee et al. |
| 2006/0286712 | A1 | 12/2006 | Brunschwiler et al. |
| 2007/0255002 | A1 * | 11/2007 | Alba .............. 524/543 |
| 2008/0001283 | A1 | 1/2008 | Lee et al. |
| 2008/0042261 | A1 | 2/2008 | Wolter et al. |
| 2008/0080144 | A1 | 4/2008 | Machiroutu |
| 2008/0213159 | A1 | 9/2008 | Sandhu |
| 2009/0022977 | A1 | 1/2009 | Dudley et al. |
| 2009/0068387 | A1 | 3/2009 | Panzer et al. |
| 2009/0166021 | A1 | 7/2009 | Slaton et al. |
| 2009/0224422 | A1 | 9/2009 | Dubin |
| 2009/0236037 | A1 | 9/2009 | Fisher et al. |
| 2009/0247652 | A1 * | 10/2009 | Silverman et al. .............. 516/33 |
| 2009/0269604 | A1 | 10/2009 | Wang et al. |
| 2009/0317660 | A1 * | 12/2009 | Heintz et al. .............. 428/688 |
| 2010/0003530 | A1 | 1/2010 | Ganguli et al. |
| 2010/0012880 | A1 * | 1/2010 | Rampersaud et al. . 252/62.51 R |
| 2010/0224352 | A1 | 9/2010 | Stuckey et al. |
| 2010/0227155 | A1 | 9/2010 | Bao et al. |
| 2010/0301258 | A1 | 12/2010 | Chen et al. |
| 2011/0042276 | A1 | 2/2011 | Miller |
| 2011/0189500 | A1 | 8/2011 | Majumdar et al. |
| 2012/0018666 | A1 | 1/2012 | Kuczynski et al. |
| 2012/0292103 | A1 | 11/2012 | Dijon |
| 2013/0020716 | A1 | 1/2013 | Kuczynski et al. |

FOREIGN PATENT DOCUMENTS

| | | | |
|---|---|---|---|
| JP | 2007012911 | A | 1/2007 |
| JP | 2009084746 | A | 4/2009 |
| JP | 2009246258 | A | 10/2009 |
| JP | 2010034254 | A | 2/2010 |
| JP | 2010050259 | A | 3/2010 |
| KR | 1020050107094 | A | 11/2005 |
| KR | 1020070023212 | A | 2/2007 |
| KR | 1020110037055 | A | 4/2011 |
| WO | 2004090944 | A2 | 10/2004 |
| WO | 2005031864 | A1 | 4/2005 |
| WO | 2006044938 | A2 | 4/2006 |
| WO | 2007089257 | A2 | 8/2007 |
| WO | 2008112013 | A1 | 9/2008 |
| WO | 2009075320 | A1 | 6/2009 |

OTHER PUBLICATIONS

Baker, R.T.K., "Synthesis, properties and applications of graphite nanofibers," Published: Jan. 1998; WTEC Hyper-Librarian, www.wtec.org/loyola/nano/us_r_n_d/09_03.htm. Downloaded May 4, 2011.

Fleischer et al., "Transient thermal management using phase change materials with embedded graphite nanofibers for systems with high power requirements," 11th Intersociety Conference on Thermal and Thermomechanical Phenomena in Electronic Systems, 2008. ITHERM 2008. May 28-31, 2008, pp. 561-566.

Ishioka et al., "Formation and Characteristics Vapor Grown Carbon Fibers Prepared in Linz-Donawitz Converter Gas," Carbon, vol. 30, No. 7, pp. 975-979. 1992.

Ishioka et al. "Formation of Vapor-Grown Carbon Fibers in CO—CO2—H2 Mixtures, I. Influence of Carrier Gas Composition," Carbon, vol. 30, No. 6, pp. 859-863, 1992.

Kopec et al., "Transient thermal performance of phase change materials with embedded graphite nanofibers," in "Thermes 2007: Thermal Challenges in Next Generation Systems," Garmella, S.V. and Fleischer, A.S., eds., Millpress, Rotterdam, The Netherlands, 2007, pp. 137-144.

Kuczynski et al. U.S. Appl. No. 12/842,200, Jul. 23, 2010.

Ruoff et al., "Mechanical and thermal properties of carbon nanotubes," Carbon, vol. 33, No. 7, pp. 925-930, 1995.

Tibbetts, Gary G., "Growing Carbon Fibers with a Linearly Increasing Temperature Sweep: Experiments and Modeling," Carbon, vol. 30, No. 3, pp. 399-406, 1992.

Weinstein et al., "The Experimental Exploration of Embedding Phase Change Materials with Graphite Nanofibers for the Thermal Management of Electronics," J. Heat Transfer, vol. 130, Issue 4. Apr. 2008. 8 pp.

Xie et al., "Dispersion and alignment of carbon nanotubes in polymer matrix: A review," Materials Science and Engineering: R: Reports, vol. 49, Issue 4, pp. 89-112, May 19, 2005.

Disclosed Anonymously, "Stretchable Thermal Interface Materials for Alignment of Graphitic Structures for Chipstack Cooling", IP.com Prior Art Database, IP.com number: IPCOM000213539D, Dec. 20, 2011.

Liu et al.,"Attachment of magnetic nanoparticles on carbon nanotubes using oleate as an interlinker molecule", Materials Chemistry and Physics vol. 116,Issues 2-3, Aug. 15, 2009, pp. 438-441.

Georgakilas et al., "Attachment of Magnetic Nanoparticles on Carbon Nanotubes and Their Soluble Derivatives", Chem. Mater., 2005, 17 (7), pp. 1613-1617, Publication Date (Web): Mar. 9, 2005.

Rodriguez, Nelly M. et al., "Catalytic Engineering of Carbon Nanostructures", American Chemical Society, Langmuir 1995, 11, pp. 3862 to 3866.

* cited by examiner

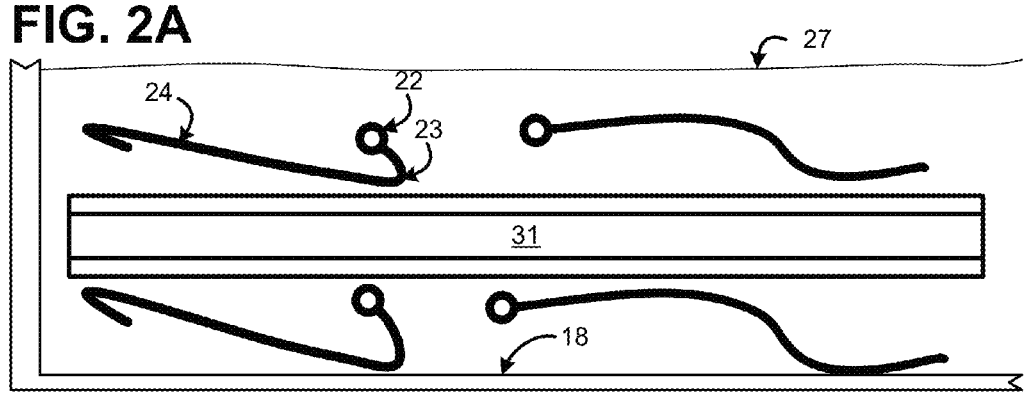
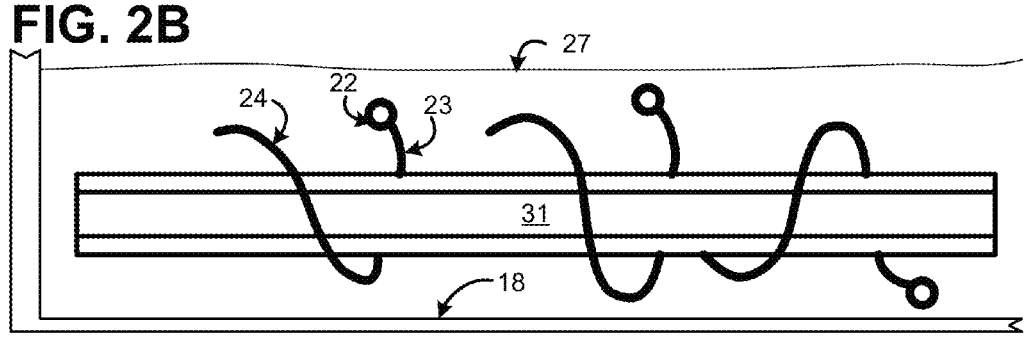
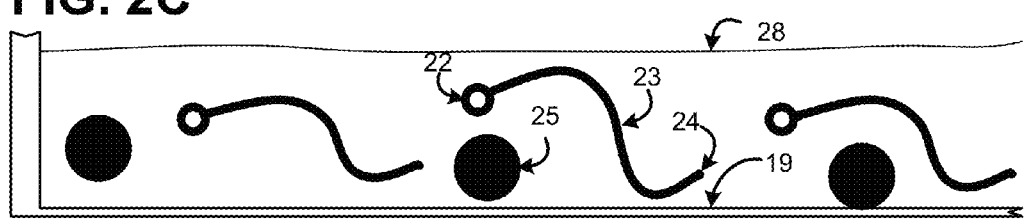
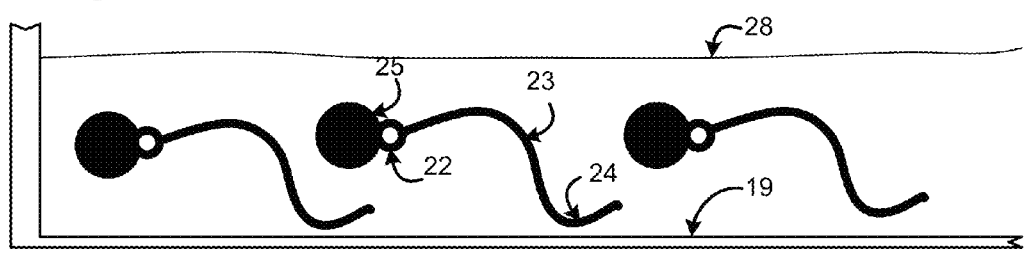

METHOD FOR ALIGNING CARBON NANOTUBES CONTAINING MAGNETIC NANOPARTICLES IN A THERMOSETTING POLYMER USING A MAGNETIC FIELD

FIELD OF THE INVENTION

The present invention generally relates to thermal interface materials, and more particularly, to matrices for rapid alignment of nanotubes containing a magnetic material for stacked chip cooling applications.

BACKGROUND

Thermal interfaces in microelectronics packages are commonly credited with a majority of the resistance for heat to escape from the chip to an attached cooling device (e.g. heat sinks, spreaders and the like). Thus, in order to minimize the thermal resistance between the heat source and cooling device, a thermally conductive paste, thermal grease, or adhesive is commonly used. Thermal interfaces are typically formed by pressing the heat sink or chip cap onto the backside of the processor chip with a particle-filled viscous medium between, which is forced to flow into cavities or non-uniformities between the surfaces.

Thermal interface materials are typically composed of an organic matrix highly loaded with a thermally conductive filler. Thermal conductivity is driven primarily by the nature of the filler, which is randomly and homogeneously distributed throughout the organic matrix. Commonly used fillers exhibit isotropic thermal conductivity and thermal interface materials utilizing these fillers must be highly loaded to achieve the desired thermal conductivity. Unfortunately, these loading levels degrade the properties of the base matrix material (such as flow, cohesion, interfacial adhesion, etc.).

It has been determined that stacking layers of electronic circuitry (i.e. 3 dimensional chip stacks) and vertically interconnecting the layers provides a significant increase in circuit density per unit area. However, one significant problem of the three dimensional chip stack is heat dissipation from the inner chips. For a four layer, 3 dimensional chip stack, the surface area presented to the heat sink by the chip stack has only ¼ of the surface area presented by the two-dimensional approach. For a 4-layer chip stack, there are three layer-layer thermal interfaces in addition to the final layer to grease/heat sink interface. The heat from the bottom layers must be conducted up thru the higher layers to get to the grease/heat sink interface.

One approach utilizes nanotubes, such as for example carbon nanotubes (CNTs), to promote heat dissipation from the inner chips. However, the CNTs are randomly oriented in the thermal interface material (TIM). CNTs and other thermally conductive carbon structures exhibit anisotropic thermal conductivity such that the thermal conductivity is orders of magnitude greater along one axis. Random distribution of the CNTs does not maximize the thermal conductivity of the TIM.

BRIEF SUMMARY

The exemplary embodiments of the present invention provide a method for enhancing internal layer-layer thermal interface performance and a device made from the method. In particular, disclosed is a method and system for aligning carbon nanotubes containing a magnetic material in a thermal interface material used in three dimensional chip stacks.

An exemplary embodiment includes a method for aligning a plurality of nanotubes containing a magnetic material in a thermal interface material to enhance the thermal interface material performance. The method includes attaching magnetic material to the plurality of nanotubes, dispersing the plurality of nanotubes containing a magnetic material into the thermal interface material, and heating the thermal interface material until the thermosetting polymer un-crosslinks. The method further includes applying a magnetic field of sufficient intensity to align the nanotubes containing a magnetic material in the thermal interface material and cooling the thermal interface material until the thermosetting polymer re-crosslinks.

Another exemplary embodiment includes a chip stack of semiconductor chips with enhanced cooling apparatus. Briefly described in terms of architecture, one embodiment of the apparatus, among others, is implemented as follows. The chip stack of semiconductor chips with enhanced cooling apparatus includes a first chip with circuitry on a first side and a second chip electrically and mechanically coupled to the first chip by a grid of connectors. The chip stack further includes a thermal interface material pad between the first chip and the second chip to conduct heat. The thermal interface material pad further comprises a plurality of nanotubes containing a magnetic material, aligned parallel to mating surfaces of the first chip and the second chip, wherein a hydrophobic tail of oleic acid is wrapped around each one of the plurality of nanotubes and a hydrophilic acid head of the oleic acid is attached to the magnetic material.

Another exemplary embodiment includes a system for aligning a plurality of nanotubes containing a magnetic material in a thermal interface material to enhance the thermal interface material performance. Briefly described in terms of architecture, one embodiment of the system, among others, is implemented as follows. The system includes a means for attaching magnetic material to the plurality of nanotubes, a means for dispersing the plurality of nanotubes containing a magnetic material into the thermal interface material, and a means for heating the thermal interface material until the thermosetting polymer un-crosslinks. The system further includes a means for applying a magnetic field of sufficient intensity to align the nanotubes containing a magnetic material in the thermal interface material, and a means for cooling the thermal interface material until the thermosetting polymer re-crosslinks.

Another exemplary embodiment includes an apparatus comprising a first object, a second object and a thermal interface material. The thermal interface material includes having a thickness between a first surface of the thermal interface material and a second surface of the thermal interface material. The thermal interface material further includes a plurality of nanotubes containing a magnetic material, aligned parallel to the first surface and the second surface, wherein a hydrophobic tail of oleic acid is wrapped around each one of the plurality of nanotubes and a hydrophilic acid head of the oleic acid is attached to the magnetic material.

These and other aspects, features and advantages of the invention will be understood with reference to the drawing figures and detailed description herein, and will be realized by means of the various elements and combinations particularly pointed out in the appended claims. It is to be understood that both the foregoing general description and the following brief description of the drawing and detailed description of the invention are exemplary and explanatory of preferred embodiments of the invention, and are not restrictive of the invention, as claimed.

BRIEF DESCRIPTION OF THE SEVERAL VIEWS OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

FIG. 2A is a block diagram illustrating an example of the nanotubes in a solution with oleic acid, wherein the oleic acid has a polar, hydrophilic, acid head group, and a hydrophobic tail.

FIG. 2B is a block diagram illustrating an example of nanotubes in a solution with oleic acid where the oleic acid has a hydrophobic tail that wraps around the nanotube leaving the oleic acid functionality extending from the nanotube surface.

FIG. 2C is a graph illustrating an example of the magnetic nanoparticles in an oleic acid solution.

FIG. 2D is a block diagram illustrating an example of the magnetic nanoparticles after each of the magnetic nanoparticles has attached to an oleic acid functionality.

Figure 1:
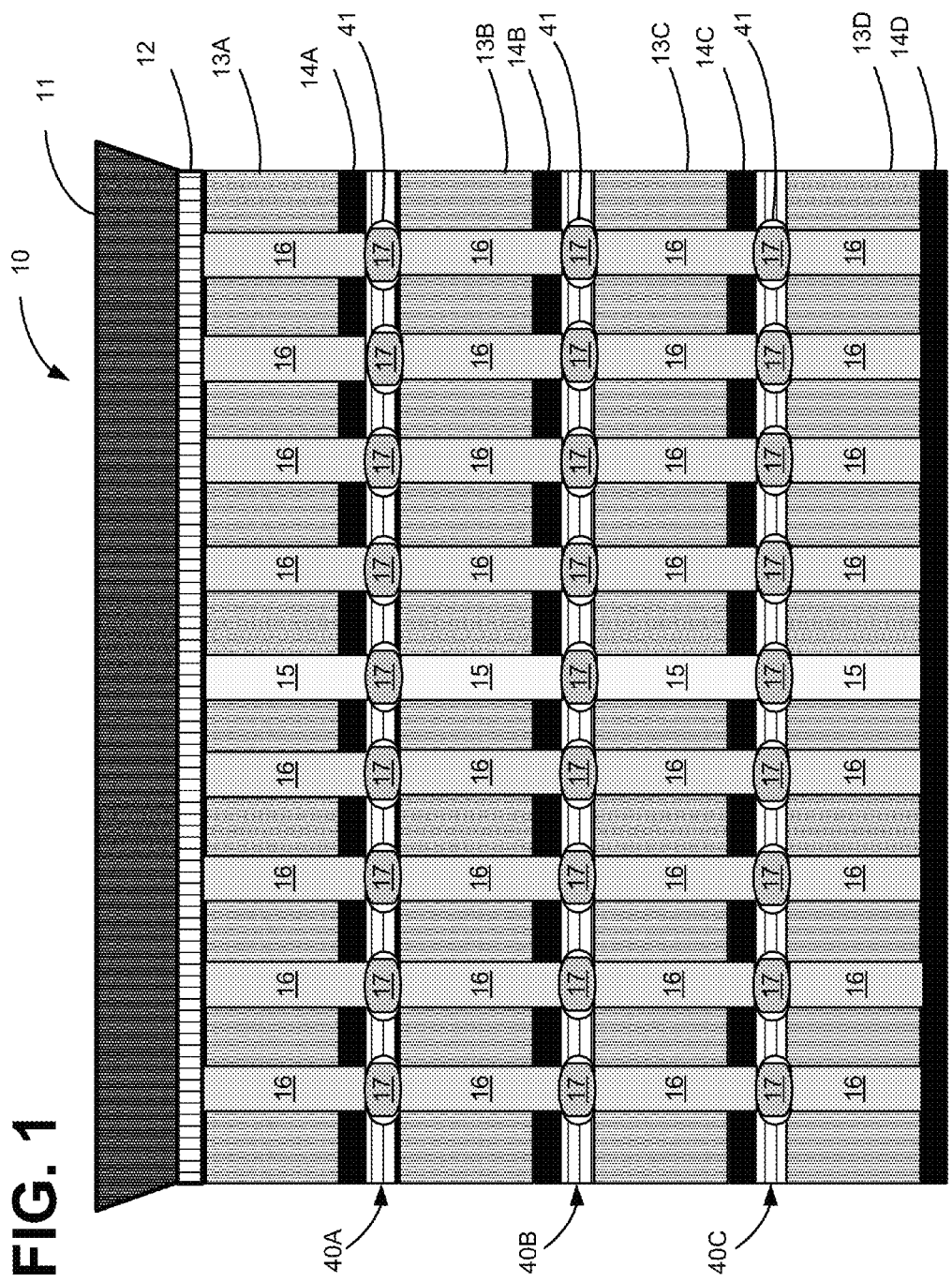
FIG. 1 is a cross section block diagram illustrating an example of the C4 or flip chip connection channels in a silicon device stack utilizing the thermal interface material with nanotubes containing a magnetic material aligned along the conductive axis in the desired direction of the present invention.

The detailed description explains the preferred embodiments of the invention, together with advantages and features, by way of example with reference to the drawings.

DETAILED DESCRIPTION

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention.

One or more exemplary embodiments of the invention are described below in detail. The disclosed embodiments are intended to be illustrative only since numerous modifications and variations therein will be apparent to those of ordinary skill in the art.

One or more exemplary embodiments of the invention disclose a thermal interface material formulation, wherein carbon nanotubes are dispersed in oleic acid in which the hydrophobic tail of the oleic acid will wrap around the carbon nanotube, leaving the oleic acid functionality extending from the carbon nanotube surface. Then the oleic acid modified carbon nanotubes are added dropwise to the magnetic nanoparticles in THF. The acid functionality will displace surface water and non-covalently bonded surfactants to bind the nanoparticles to the carbon nanotubes. The carbon nanotubes containing magnetic nanoparticles are then removed from solution using a magnet, dispersed in a silicone matrix, and a magnetic field is applied to align the carbon nanotubes.

One or more exemplary embodiments of the invention is directed to providing a thermal interface material that is placed between chips in a chip stack. The thermal interface material having carbon nanotubes, containing a magnetic material, is aligned to efficiently transfer heat to at least two sides (e.g., east and west, or north and south) of a chip stack.

In one embodiment, all nanotubes containing a magnetic material are aligned "east/west" and draw the heat to heat sinks (i.e. heat dissipating objects) on the east and west sides of the chip stack. In another embodiment, the pads are alternated among chips so that alternating layers draw heat to heat sinks on the east/west sides of the chip stack and to the north/south side of the chip stack. In still another embodiment, pieces of the pads are arranged such that two opposite sides of the arrangement conduct heat east/west and another two opposite sides conduct heat north/south. In this embodiment, the nanotubes containing a magnetic material are arranged so that both ends are perpendicular to the closest edge of the pad.

A thermal interface material is used to fill the gaps between thermal transfer surfaces, such as between microprocessors and heat sinks, in order to increase thermal transfer efficiency. These gaps are normally filled with air, which is a very poor conductor. A thermal interface material may take on many forms. The most common is the white-colored paste or thermal grease, typically silicone oil filled with aluminum oxide, zinc oxide, or boron nitride. Some brands of thermal interface materials use micronized or pulverized silver. Another type of thermal interface materials are the phase-change materials. The phase change materials are solid at room temperature, but liquefy and behave like grease at operating temperatures.

A phase change material is a substance with a high heat of fusion which, melting and solidifying at a certain temperature, is capable of storing and releasing large amounts of energy. Heat is absorbed or released when the material changes from solid to liquid and vice versa; thus, phase change materials are classified as latent heat storage units.

Phase change materials latent heat storage can be achieved through solid-solid, solid-liquid, solid-gas and liquid-gas phase change. However, the only phase change used for thermal interface materials is the solid-liquid change. Liquid-gas phase changes are not practical for use as thermal storage due to the large volumes or high pressures required to store the materials when in their gas phase. Liquid-gas transitions do have a higher heat of transformation than solid-liquid transitions. Solid-solid phase changes are typically very slow and have a rather low heat of transformation.

Initially, the solid-liquid phase change materials behave like sensible heat storage materials; their temperature rises as they absorb heat. Unlike conventional sensible heat storage, however, when phase change materials reach the temperature at which they change phase (i.e. melting temperature) they absorb large amounts of heat at an almost constant temperature. The phase change material continues to absorb heat without a significant rise in temperature until all the material is transformed to the liquid phase. When the ambient temperature around a liquid material falls, the phase change material solidifies, releasing its stored latent heat. A large number of phase change materials are available in any required temperature range from −5 up to 190° C. Within the human comfort range of 20° to 30° C., some phase change materials are very effective. They can store 5 to 14 times more heat per unit volume than conventional storage materials such as water, masonry, or rock.

It is well known that the incorporation of certain types of carbon nanotubes into thermal interface material can impart thermal conductivity to such materials. Carbon nanotubes, can be dispersed in thermal interface material by various well-known techniques. These techniques include, but are not limited to, melting, kneading and dispersive mixers to form an admixture that can be subsequently shaped to form a thermally conductive article.

Carbon nanotubes (CNTs) are allotropes of carbon with a cylindrical nanostructure. Nanotubes have been constructed with a length-to-diameter ratio of up to 132,000,000:1, significantly larger than any other material. They exhibit extraordinary strength and unique electrical properties, and are efficient thermal conductors. Nanotubes are members of the fullerene structural family, which also includes the spherical buckyballs. The ends of a nanotube may be capped with a hemisphere of the buckyball structure. Their name is derived from their size, since the diameter of a nanotube is on the order of a few nanometers (approximately 1/50,000th of the width of a human hair), while they can be up to 18 centimeters in length.

Carbon nanotubes have received considerable attention in the electronics field due to their remarkable thermal conductivity. Moreover, the thermal conductivity of carbon nanotubes are anisotropic. Anisotropy is the property of being directionally dependent, as opposed to isotropy, which implies homogeneity in all directions. Therefore, the present invention takes advantage of the anisotropic nature of the carbon nanofibers and nanotubes by effectively aligning them along the conductive axis, thereby generating a thermal interface material with exceptional thermal conductivity at comparatively low loading levels. Diamond, graphite, and graphite fibers have been known as excellent heat conductors with a high thermal conductivity up to 3000 W/m-K.

Currently in known thermal interface materials, the polymeric matrix when the alignment would occur is very viscous. This makes alignment difficult. In one embodiment of the present invention is a TIM formulation that allows for carbon nanotube-like structures to be aligned once dispersed into a silicon matrix. This allows for a more facile method of alignment. Once alignment is accomplished, the silicon matrix is cured (i.e. temperature is applied) and the TIM converts to a solid gel.

Referring now to the drawings, in which like numerals illustrate like elements throughout the several views. FIG. 1 is a cross section block diagram illustrating an example of a controlled collapse chip connection 17 (i.e. C4) or flip chip electrically conductive channels 16 and thermal conductive channels 15 utilized in a chip stack 10.

The chip stack 10 comprises a multitude of chips 13 (A-D) that further include one or more electrically conductive channels 16 and/or thermal conductive channels 15, which extend through a chip 13 from the top surface to the bottom surface. In one embodiment, the "conductive channel" is really a combination of two or more thru-silicon-vias (TSVs) connected sequentially by one or more controlled collapse chip connections 17 (C4s).

Preferably, the electrically conductive channels 16 are formed of tungsten or copper; however, other conductive materials may be used and are contemplated. The electrically conductive channels 16 selectively conduct electrical signals to and from portions of the circuitry 14 thereon or simply couple to solder bumps 17 to interconnect differing chips 13 in the chip stack 10 (e.g., chips 13A and 13B), or both. The solder bumps 17 are located within an area 41 of a thermal interface material (TIM) pad 40. In one embodiment, the area 41 is punched out of the TIM pad 40. In another embodiment, the area 41 is formed during the creation of the TIM pad 40.

The TIM pad 40 comprises carbon nanotubes (CNTs), carbon nanofibers (CNF), graphitic nanofibers (GNFs) or the like, that are dispersed in a phase change material (PCM) or a silicone matrix. After dispersing the CNTs, CNFs or GNFs in the PCM, they are then aligned in the xy plane (i.e. positioned parallel to the surface of the chip 13). This is so that heat may be brought to the edges of the chip stack 10. Once the heat is brought to the edges of the chip stack 10, multiple heat sinks or other type devices may be utilized to more efficiently dissipate that heat of the chip stack 10.

In one embodiment, CNTs, CNFs or GNFs are aligned in the thermal interface material 30 in one direction by an applied magnetic field. Aligning the CNTs, CNFs or GNFs along the conductive axis in the xy plane of the 3D chip stack 10 creates a TIM pad 40 with exceptional thermal conductivity at comparatively low loading levels. The system and method for aligning graphitic nanofibers to enhance thermal interface material performance are described in commonly assigned and co-pending U.S. Patent Application entitled "A METHOD AND SYSTEM FOR ALIGNMENT OF CARBON NANOFIBERS FOR ENHANCED THERMAL INTERFACE MATERIAL PERFORMANCE", Ser. No. 12/842,200 filed on, Jul. 23, 2010, and U.S. Patent Application entitled "A System and Method to Process Horizontally Aligned Graphite Nanofibers in a Thermal Interface Material Used in 3D Chip Stacks", Ser. No. 13/188,572 filed on, Jul. 22, 2011, both herein incorporated by reference.

Preferably, the thermal conductive channels 15 are formed and filled with conductive materials, metal or alternatively are formed of thermal grease. The thermal grease is typically silicone oil filled with aluminum oxide, zinc oxide, or boron nitride; however, other conductive materials may be used and are contemplated. Some brands of thermal conductive channels 15 use micronized or pulverized silver. Another type of thermal conductive channels 15 are the phase-change materials. The phase change materials are solid at room temperature, but liquefy and behave like grease at operating temperatures. The thermal conductive channels 15 conduct heat to and from portions of the circuitry 14 thereon. The thermal conductive channels 15 couple to solder bumps 17 to interconnect differing chips 13 in the chip stack 10 (e.g., chips 13A and 13B), couple to heat sink 11 through thermal grease 12 or TIM pad 40 of the present invention, that conducts the heat to the side of the chip stack 10.

The electrically conductive channels 16 couple to solder bumps 17 on a bond pad (not shown) on the bottom surface of chip 13 (A-C). The solder bumps 17 are electrically isolated from the chip 13 and one another according to conventional practice. In addition, the electrically conductive channels 16 are preferably electrically insulated from the chip 13 by insulating regions (not shown) which are disposed between the electrically conductive channels 16 and the chip 13. The insulating regions preferably are silicon dioxide ($SiO_2$); however, other insulating materials may be employed and are contemplated as falling within the scope of the present invention. The insulating regions prevent the signals being transmitted in the electrically conductive channels 16 from disturbing the bias voltage of the chip 13 (which is typically either at ground potential or a Vdd). Of course, in some cases, one of the terminals of the circuitry 14 on the top surface may be held at a substrate potential, in which case, the appropriate electrically conductive channel 16 may be non-insulated and thus be in electrical contact with the chip 13 being held at a similar potential, as may be desired.

As shown, each chip 13 uses electrically conductive channels 16 in a controlled, collapse chip connection (C4) structure (also often called solder bump or flip-chip bonding). The chip stack 10 includes a base chip 13A. Solder bumps 17 are then placed on a bond pad (not shown) for the electrically conductive channels 16 of a second (or top) chip 13A, which is oriented face-down (i.e., flip-chip), aligned and brought into contact with the electrically conductive channels 16. Electrical interconnections between the electrically conductive channels 16 are formed by heating the solder bumps 17 to a reflow temperature, at which point the solder flows. After the solder flows, subsequent cooling results in a fixed, electrically conductive joint to be formed between the electrically conductive channels 16.

The base chip 13A on one side is attached to a heat sink 11 with thermal grease 12. In an alternative embodiment, a thermal interface material incorporating vertically aligned carbon (graphite) nanofibers can be utilized in place of thermal grease 12 as a very effective thermal interface material between a top of base chip 13A and a heat sink 11. Such an arrangement is disclosed in U.S. Patent Application (entitled "A METHOD AND SYSTEM FOR ALIGNMENT OF CARBON NANOFIBERS FOR ENHANCED THERMAL INTERFACE MATERIAL PERFORMANCE", Ser. No. 12/842,200. Other chips 13B-13D can have C4 connection structures implemented on both the top surface and bottom surface thereof, as illustrated in FIG. 1. In such instances, a second chip 13B may similarly be oriented facedown with respect to the base chip 13A and coupled thereto-using solder bumps 17.

The C4 structure of FIG. 1 overcomes one disadvantage of the connection methodologies. Initially, because the ball-bonding attachment technique is avoided, significantly less stress is placed on the solder bump 17 during connection, which allows circuitry 14 (A-C) to be formed under the solder bump 17. The circuitry 14 (A-C) is formed according to any one of many conventional semiconductor processing techniques. However, the C4 structure of FIG. 1 has one major disadvantage of not being able to dissipate the heat generated by circuitry 14 (A-D). The TIM pad 40 of the present invention comprises carbon nanotubes (CNTs), carbon nanofibers (CNFs) or graphitic nanofibers (GNFs) that are dispersed in a phase change material (PCM) or a silicone matrix. The CNTs, CNFs or GNFs are aligned in the position parallel to the surface of the chip 13. This is so that heat may be brought to the edges of the chip stack 10. Once the heat is brought to the edges of the chip stack 10, multiple heat sinks or other type devices may be utilized to more efficiently dissipate that heat of the chip stack 10. In one embodiment, all carbon nanotubes are aligned "east/west" and draw the heat to heat sinks on the east and west sides of the chip stack.

FIG. 2A is a block diagram illustrating an example of the carbon nanotubes 31 in container 18, in a solution 27 containing oleic acid 23. The oleic acid 23 has a polar, hydrophilic, acid head group 22, and a hydrophobic tail 24. Oleic acid 23 acts as a surfactant and causes the hydrophobic tail 24 to wrap around the carbon nanotube 31. Oleic acid 23, being a long chain (18 carbon atoms) fatty acid, behaves as a surfactant. That is, the long carbon tail is a hydrophobic tail 24, whereas the acid head group 22 is carboxylic and therefore hydrophilic. Using the 'like dissolves like' rule, when the carbon nanotubes 31 are dispersed in the solution 27 with oleic acid 23, the hydrophobic tail 24 of oleic acid 23 will wrap around the carbon nanotubes 31 driven by thermodynamics. An example of this wrapping of the hydrophobic tail 24 of oleic acid 23 is illustrated in FIG. 2B. FIG. 2B is a block diagram illustrating an example of carbon nanotubes 31 in container 18, in the solution 27 with oleic acid 23, where the oleic acid 23 has a hydrophobic tail 24 that wraps around the carbon nanotube 31 leaving the oleic acid 23 functionality extending from the surface of the carbon nanotube 31.

FIG. 2C is a graph illustrating an example of magnetic nanoparticles 25 in a solution 28 containing oleic acid 23 in container 19. Exemplary magnetic nanoparticles 25 include, but are not limited to: Magnetite ($Fe_3O_4$), Ferrite ($BaFe_{12}O_{19}$), Metallic nanoparticles with a shell, e.g., CoO layer on the surface of a Co nanoparticle, Maghemite ($Fe_2O_3$, γ-$Fe_2O_3$), and the like. As such, the magnetic nanoparticles 25 will invariably contain surface water. Upon addition of oleic acid 23, the hydrophilic acid head 22 of oleic acid 23 will displace the surface water molecules from the magnetic nanoparticles 25. FIG. 2D is a block diagram illustrating an example of the magnetic nanoparticles 25 after each of the magnetic nanoparticles 25 has attached to the hydrophilic acid head 22 of oleic acid 23.

Figure 2E:
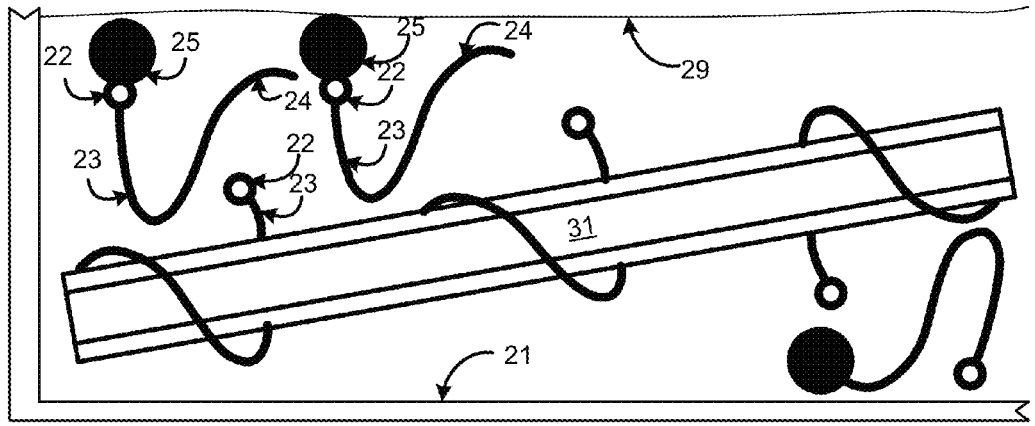
FIG. 2E is a block diagram illustrating an example after the magnetic nanoparticles having oleic acid are dispersed into tetrahydrofuran (THF) and the nanotubes having oleic acid are dispersed into the THF.

FIG. 2E is a block diagram illustrating an example of the magnetic nanoparticles 25 with the long carbon chain of attached oleic acid 23 extending off of them, illustrated in FIG. 2C-D, dispersed into a solution 29 of tetrahydrofuran (THF) in container 21. Then the carbon nanotubes 31 having oleic acid 23 are dispersed into the solution 29 of THF.

Figure 2F:
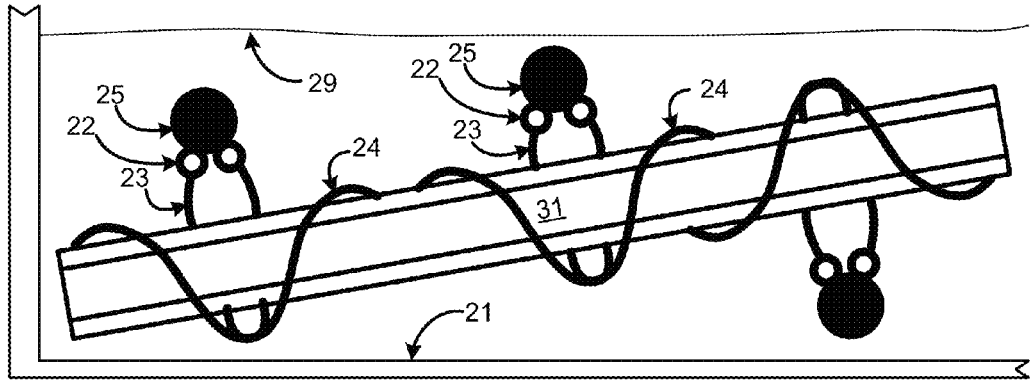
FIG. 2F is a block diagram illustrating an example of a nanotube in the THF where the oleic acid has a hydrophobic tail that wraps around the nanotube leaving the oleic acid functionality extending from the nanotube surface to attach to the magnetic nanoparticles.

FIG. 2F is a block diagram illustrating an example of a carbon nanotube 31 in the THF solution 29 in container 21. The oleic acid 23 has a hydrophobic tail 24 that wraps around the carbon nanotube 31 leaving the oleic acid 23 functionality extending from the carbon nanotube 31 surface to attach to the magnetic nanoparticles 25. The long hydrophobic chains 24 intertwine, the result being magnetic nanoparticles 25 attached to carbon nanotubes 31.

Figure 2G:
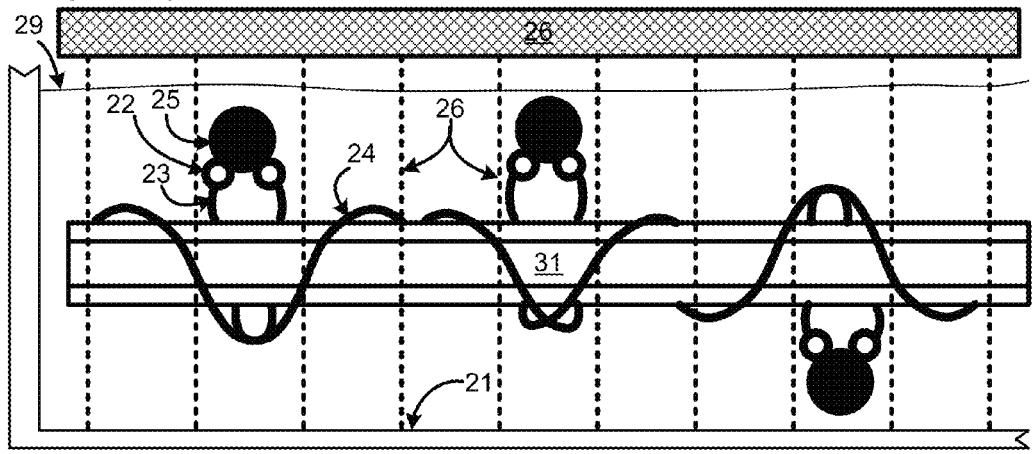
FIG. 2G is a block diagram illustrating an example of using a magnet to remove the nanotube having attached magnetic nanoparticles from the THF solution.

FIG. 2G is a block diagram illustrating an example of using a magnet 26 to remove the carbon nanotubes 31 having attached magnetic nanoparticles 25 from the THF solution 29 in container 21. The carbon nanotubes 31 having attached magnetic nanoparticles 25 are then dried by evaporating off the THF The carbon nanotubes 31 having attached magnetic nanoparticles 25 are then placed into a thermal interface material 30.

Figure 3A:
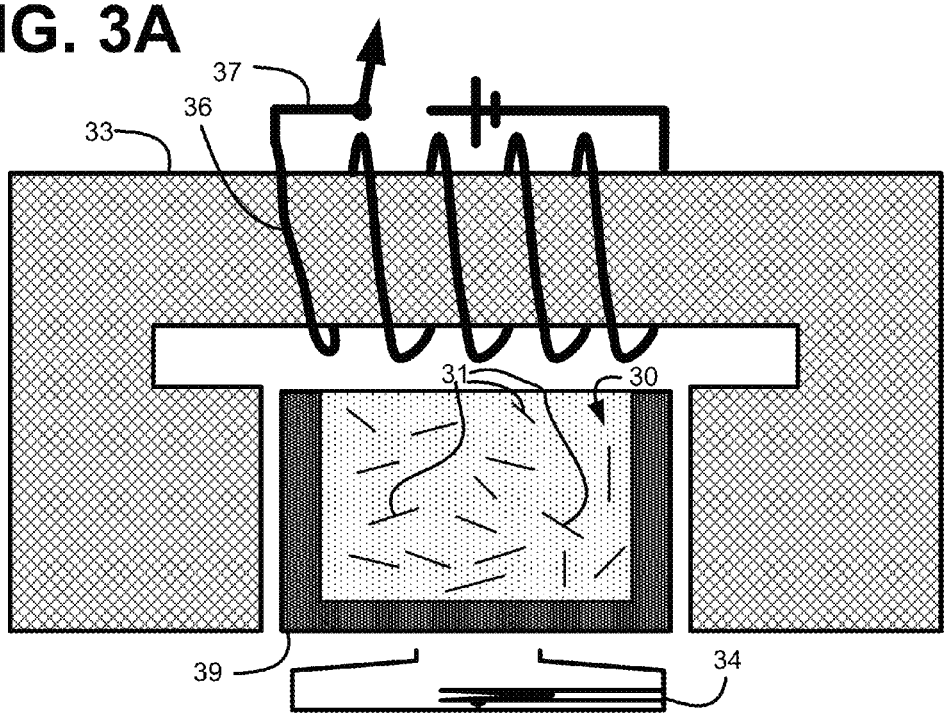
FIG. 3A is a block diagram illustrating an example of the carbon nanotubes containing a magnetic material, randomly dispersed in a thermal interface material.

FIG. 3A is a block diagram illustrating an example of the carbon nanotubes 31 containing a magnetic material, randomly dispersed in the thermal interface material 30. The carbon nanotubes 31 are disbursed into the melted thermal interface material 30 using well-established methods. In one embodiment, a high-speed dispersive mixer can be utilized. The carbon nanotubes 31 typically are dispersed essentially homogeneously throughout the bulk of the thermal interface material 30. As shown there is thermal interface material 30 in a crucible 39. The crucible 39 is heated to a temperature so that the thermal interface material 30 melts.

In the preferred embodiment, heat from well-established heating apparatuses 34 is applied to un-crosslink the least one polymer in the thermal interface material 30. In this embodiment, the thermal interface material 30 is melted at a temperature 10 C-20 C above the thermal interface material 30 melting temperature. In an alternative embodiment, a solvent or reactive chemical is applied to the thermal interface material 30 to un-crosslink the least one polymer in the thermal interface material. In still another alternative embodiment, a disulfide crosslinked epoxy can be used. The disulfide bond can be reduced using phosphines and then oxidized to reform the disulfide bond. Each example embodiment renders the gel like thermal interface material 30 into a lower viscosity material allowing for a more facile method of alignment.

Figure 3B:
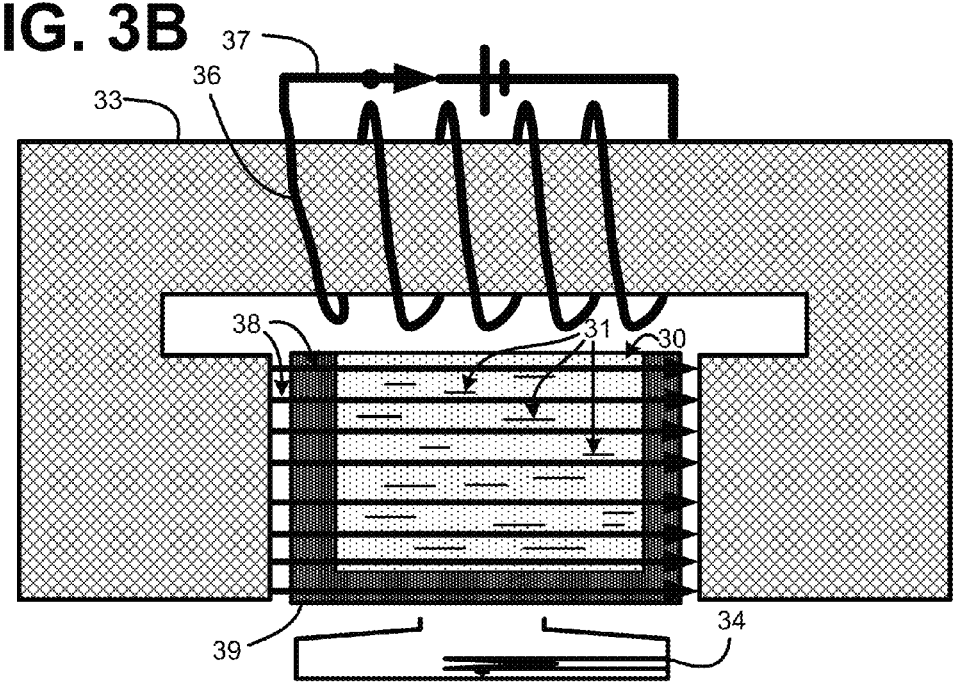
FIG. 3B is a block diagram illustrating an example of the heated thermal interface material with nanotubes containing a magnetic material aligned by a magnetic field to orient the conductive axis in the desired direction in the thermal interface material.
Figure 4A:
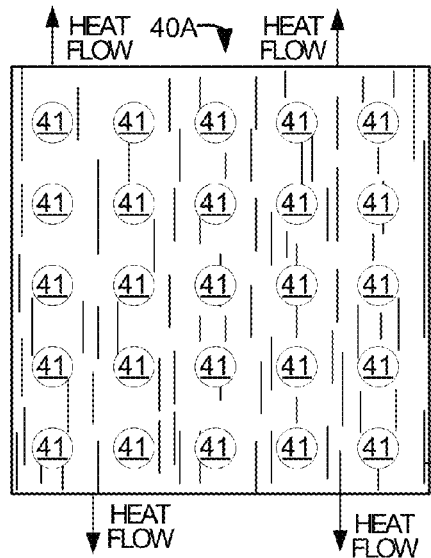
FIGS. 4A and 4B are block diagrams illustrating an example of the thermal interface material with graphite nanofibers aligned by a magnetic field and heat to orient the conductive axis in perpendicular directions to the thermal interface material, and having a plurality of punch holes formed at various locations thereon.
Figure 4B:
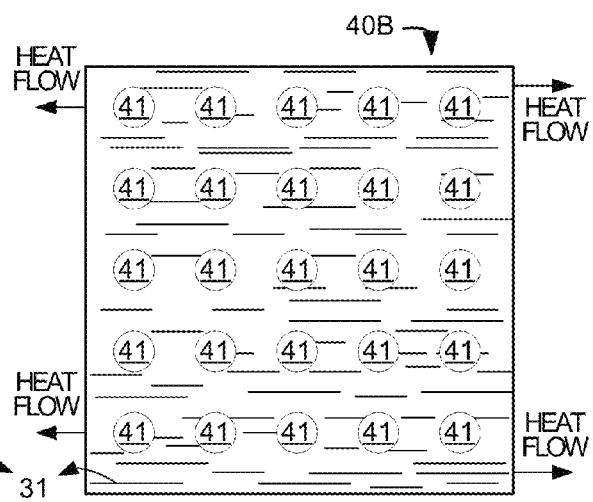
Figure 4C:
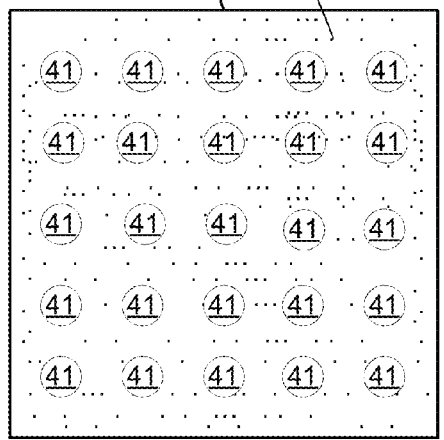
FIG. 4C is a block diagram illustrating an example of a top view of the thermal interface material with graphite nanofibers aligned by a magnetic field to orient the conductive axis in perpendicular directions to the thermal interface material, and having a plurality of punch holes formed at various locations thereon.
Figure 5:
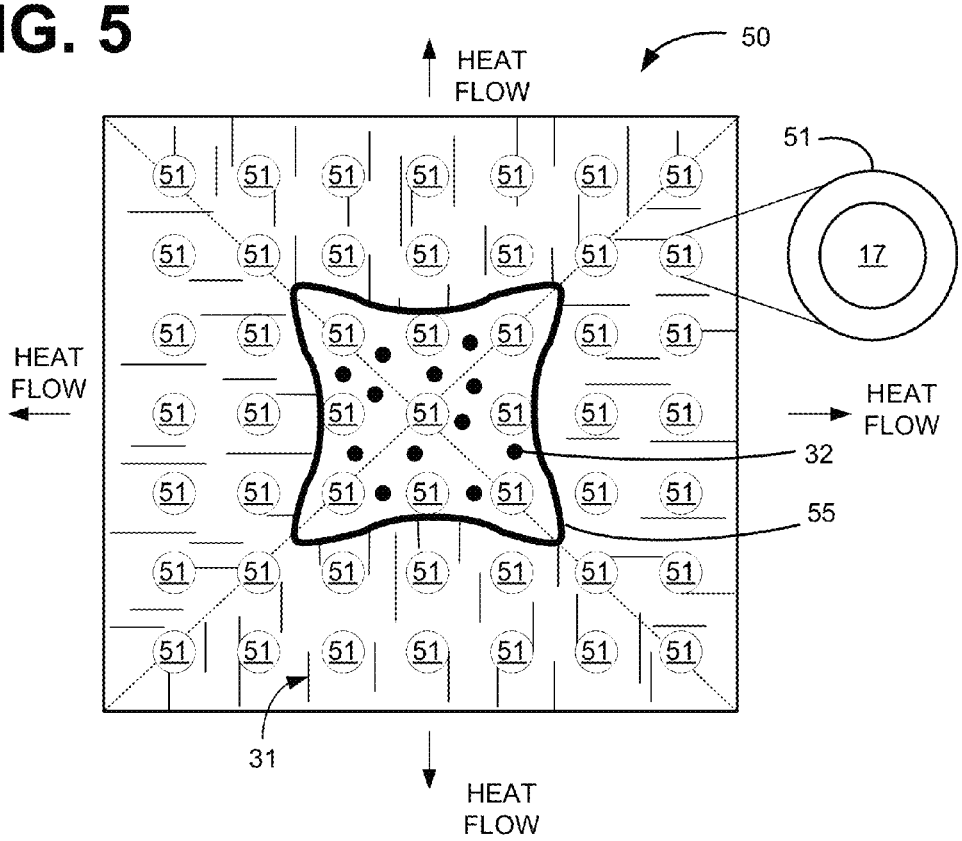
FIG. 5 is a block diagram illustrating an example of the thermal interface material with nanofibers containing a magnetic material arranged such that two opposite sides of the thermal interface material with nanofibers are aligned to conduct heat in the east/west direction and another two opposite sides conduct heat in the north/south direction, as wherein the core of the thermal interface material conducts heat perpendicular to the east/west direction and north/south directions.
Figure 6:
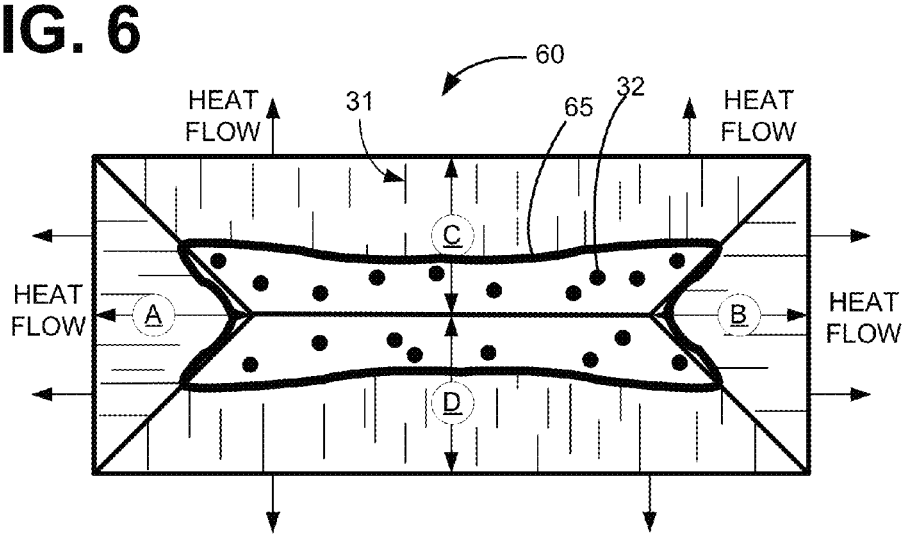
FIG. 6 is a block diagram illustrating another example of the thermal interface material with nanofibers containing a magnetic material arranged such that two opposite sides of the thermal interface material with nanofibers containing a magnetic material are aligned to conduct heat in the east/west direction and another two opposite sides conduct heat in the north/south direction, wherein the core of the thermal interface material conducts heat perpendicular to the east/west direction and north/south directions.

FIG. 3B is a block diagram illustrating an example of the thermal interface material 30 with carbon nanotubes 31 aligned by a magnetic field 38 to orient the conductive axis in the desired direction in the thermal interface material 30. In one embodiment, crucible 39 is surrounded on two sides by electromagnet 33. The magnetic fields 38 are generated in the electromagnet 33 by coils 36 around the electromagnet 33. The coils are connected to switch 37, which enables power to be applied. In the preferred embodiment, a magnetic field 38 is applied in a direction parallel to sides of a pad that would be in contact with semiconductor chips or other like electronic devices. The field is strong enough to align the carbon nanotubes 31 containing magnetic nanoparticles 25. The carbon nanotubes 31 can be aligned in the xy plane. In one embodiment, the long axis of the carbon nanotubes 31 are aligned in an orientation parallel to the mating surfaces as illustrated in FIGS. 4A and 4B. In another embodiment, the carbon nanotubes 31 are aligned in an orientation perpendicular to the mating surfaces as illustrated in FIG. 4C. In still another embodiment, the carbon nanotubes 31 are aligned in an orientation parallel to the mating surfaces, such that two opposite sides of the thermal interface material 30 have carbon nanotubes 31 aligned in one direction parallel with the sides of the thermal interface material 30 and other carbon nanotubes 31 on opposite sides aligned in a second direction perpendicular to the first direction and still parallel with the mating surfaces as illustrated in FIGS. 5 and 6.

The crucible 39 is cooled to approximately room temperature. Once the crucible 39 with the aligned carbon nanotubes 31 in the phase change material has cooled to approximately room temperature, the thermal interface material 30 is removed from the crucible 39. In one embodiment, room temperature is normally within the range of 60 to 80° F., or 15° C. to 27° C. The thermal interface material 30 can be, but is not limited to, paraffins ($C_nH_{2n+2}$); fatty acids ($CH_3(CH_2)_{2n}COOH$); metal salt hydrates ($M_nH_2O$); and eutectics (which tend to be solutions of salts in water). In still another embodiment, the thermal interface material 30 can be silicone-based gels or pastes that are eventually cured into pads.

According to the present disclosure, the thermal conductivity at desired locations is increased by TIM pads 40 and block 45 with aligned carbon nanotubes 31 between the multiple chips 13A-D. By utilizing the TIM pad 40 with aligned carbon nanotubes 31 between multiple chips 13A-D, more heat transfer to the edge of the chip stack 10 can be achieved. The advantage of this solution is that it further reduces chip temperatures through no modification to the chip surface and does not require changes to the manufacturing line or the addition of more components to the system such as liquid coolants and microchannel heat exchangers.

Figure 3C:
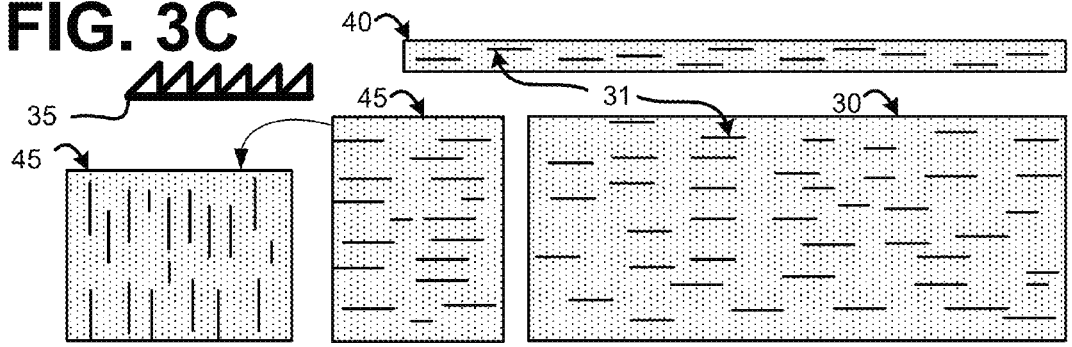
FIG. 3C is a block diagram illustrating an example of the slicing the thermal interface material into the desired footprint.

FIG. 3C is a block diagram illustrating an example of the slicing of the thermal interface material 30 into the desired footprint or TIM pad 40 and block 45. TIM pads 40 of appropriately sized geometry (length X and width Y) are cut from the slab of thermal interface material 30 using conventional techniques of dicing apparatus 35 known to those skilled in the art. The geometry of TIM pads 40 and TIM blocks 45, are dictated by the footprint of the integrated circuitry 14 on chips 13(A-D) to which the TIM pads 40 and 45, will be mated. TIM blocks 45 of appropriately sized geometry (length X and width Y) are cut from the slab of thermal interface material 30 using conventional techniques of dicing apparatus 35 known to those skilled in the art. The block 45 is rotated so that the carbon nanotubes 31 are vertically aligned. In one embodiment, the footprint of the vertical shaft to which the TIM pads 50 or 60, is constructed around the geometry of block 45 as shown in FIGS. 5 and 6 as blocks 55 and 65 respectively.

FIGS. 4A and 4B are block diagrams illustrating an example of a top view of the TIM pad 40 with carbon nanotubes 31 aligned by a magnetic field 38 to orient the conductive axis in perpendicular directions to the TIM pad 40, and having a plurality of areas 41 formed at various locations thereon. Areas 41 provide space for the solder bumps 17 that are formed on electrically conductive channels 16, on the chip 13. The solder bumps 17 rest on electrically conductive channels 16 to connect one chip to another chip through TIM pad 40 to electrically conductive signals from, for example, chip 13A to another chip 13B. In another embodiment, the solder bumps 17 can conduct heat from, for example, chip 13A to another chip 13B thru thermal conductive channels 15 and eventually to heat sink 11. In another embodiment, the solder bumps 17 can conduct heat laterally from the solder bumps 17 through TIM pad 40(A-B) and between two chips 13(A-D) to the edges of the chip stack 10. In still another embodiment, the direction of the carbon nanotubes 31 in TIM pads 40 are alternated among chips so that alternating layers draw heat to heat sinks on the east/west sides of the chip stack and to the north/south side of the chip stack.

As shown, the plurality of solder bumps 17 and areas 41 are circular, however, this is for illustration only and the solder bumps 17 and areas 41 may be of any shape including, but not limited to, triangular, rectangular, square, circular, elliptical, irregular or any four or more sided shape. The size and shape of areas 41 are generally determined by the size and shape of solder bump 17. This is in order to provide a space in the TIM pad 40 for the solder bumps 17.

Also as shown, the solder bumps 17 and areas 41 in one embodiment are laid out in regular patterns, however, this is for illustration only and the solder bumps 17 and areas 41 have the flexibility to be laid out in any desired pattern. This additional level of flexibility allows the circuitry on chips 13(A-D) to be laid out without regard to the solder bumps 17 and areas 41 locations. This further allows the solder bump 17 locations above the circuitry on chips 13(A-D) to be located in an optimized fashion, to directly couple with circuitry on another chip 13. In another embodiment, the solder bumps 17 and areas 41 may be formed in a pattern where the electrically conductive channels 16 provide power at the periphery of the chip 13 to aid in cooling the chip 13. Therefore, the solder bumps 17 and areas 41 may be located anywhere on the chip 13A-D as illustrated in FIG. 1, without the need to form such interconnections on peripheral edges of the die. The solder bumps 17 are located within an area 41 (FIG. 4(A-C)) of a thermal interface material (TIM) pad 40. In one embodiment, the area 41 is punched out of the TIM pad 40. In another embodiment, the area 41 is formed during the creation of the TIM pad 40. A TIM pad 40 is used to remove any gaps between thermal transfer surfaces, such as between chips 13 (A-D), microprocessors and heat sinks, in order to increase thermal transfer efficiency. Any gaps are normally filled with air, which is a very poor conductor.

FIG. 4C is a block diagram illustrating a top view example of the TIM block 45 with carbon nanotubes 31 oriented with the conductive axis in parallel with the electrically conductive channels 16 and/or thermal conductive channels 15 on the TIM block 45. There are a plurality of areas 41 formed at various locations thereon. These areas 41 are for the solder bumps 17 to connect chips 13(A-D) together. In an alternative embodiment, a second TIM block 45 is in thermal contact with the center of TIM blocks 45 between chips 13(A-D) to effectively draw heat to a chip above and below to ultimately connect to heat sink 11 on a top of the chip stack 10. In another alternative embodiment, the additional TIM blocks 45 are in thermal contact with edges of TIM pads 40 hanging out between chips 13(A-D) to effectively draw heat to a heat sink 11 on the sides of the chip stack 10.

Figure 4D:
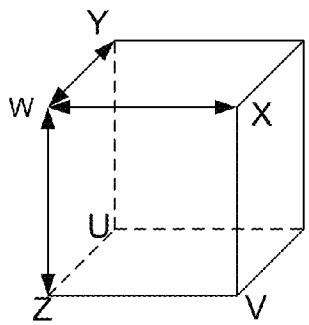
FIG. 4D is a block diagram illustrating an example of the vectors in which the graphite nanofibers are aligned.

FIG. 4D is a block diagram illustrating an example of the vectors in which the carbon nanotubes 31 are aligned. In this illustration, the carbon nanotubes 31 are either horizontally (i.e. XWY plane) or vertically (i.e. XWZ plane) aligned through the chip stack using carbon nanotubes 31, as shown in FIGS. 4A-4C. The vertical carbon nanotubes 31 (i.e XWZ plane) are in a plane perpendicular to the horizontal carbon nanotubes 31 (i.e. XWY plane). In order to differentiate the carbon nanotubes 31 oriented in the horizontal plane (i.e. XWY plane) from the carbon nanotubes 31 oriented in the vertical plane (i.e. XWZ plane), from now on those carbon nanotubes oriented in the vertical plane (i.e. XWZ plane) will be referred to as carbon nanotubes 32. This means that the carbon nanotubes 31 are always aligned in the horizontal plane (i.e. XWY plane) perpendicular to the closest side edge (i.e. not top or bottom) of TIM pad 50. Whereas, carbon nanotubes 32 on block 45 are aligned in the vertical plane (i.e. XWZ plane) and always perpendicular to all carbon nanotubes 31.

FIG. 5 is a block diagram illustrating a top down view example of the TIM pad 50 with carbon nanotubes 31 arranged such that two opposite sides of the TIM pad 50 with carbon nanotubes 31 conduct heat in one direction parallel with the sides of the TIM pad 50 in contact with chip 13 and another two on opposite sides conduct heat in a second direction perpendicular to the first direction and still parallel with the sides of the TIM pad 50 in contact with chip 13. The illustrated example also shows the TIM pad 50 with a vertical TIM block 55 (i.e. thermal channel) that includes carbon nanotubes 32 that are perpendicular to all carbon nanotubes 31 in the TIM pad 50. In this embodiment, the bi-directional TIM pad 50 displayed in the top down view illustrated in FIGS. 4A and 4B can be easily sectioned and connected together to conduct heat to all four sides of the chip stack using carbon nanotubes 31, and vertically through the vertical heat transmission block 45 using carbon nanotubes 32, as shown. The vertical TIM block 55 is formed (i.e. cut) from block 45 illustrated in FIG. 4C. This means that the carbon nanotubes 31 are always aligned in the horizontal plane (i.e. XWY and VZU plane) perpendicular to the closest edge of TIM pad 50. Whereas the carbon nanotubes 32 on vertical TIM block 55 are aligned in the vertical plane (i.e. YWZ plane) and always perpendicular to all carbon nanotubes 31. In this embodiment, the pattern areas for the chip solder bumps 17 on TIM pad 50 are generally applied after assembling the TIM pad 50. This is to ensure that the area for the chip solder bumps 17 on chips 13(A-D) are properly aligned. The solder bumps 17 are located within an area 51 of a thermal interface material (TIM) pad 50. In one embodiment, the area 51 is punched out of the TIM pad 50. In another embodiment, the area 51 is formed during the creation of the TIM pad 50.

FIG. 6 is a block diagram illustrating another example of the TIM pad 60 with carbon nanotubes 31 arranged such that two opposite sides of the TIM pad 60 with carbon nanotubes 31 conduct heat in one direction parallel with the sides of the TIM pad 60 in contact with chip 13 and another two on opposite sides conduct heat in a second direction perpendicular to the first direction and still parallel with the sides of the TIM pad 60 in contact with chip 13. The illustrated example also shows the TIM pad 60 with a vertical TIM block 65 (i.e. channel) that includes carbon nanotubes 32 that are perpendicular to all carbon nanotubes 31 in the TIM pad 60. In this embodiment, the bi-directional TIM pad 60 displayed in the top down view illustrated in FIGS. 4A and 4B can be easily sectioned and connected together to conduct heat to all four sides of the chip stack using carbon nanotubes 31 and vertically through the vertical heat transmission block 45 illustrated in FIG. 4C using carbon nanotubes 32, as shown. This means that the carbon nanotubes 31 are always aligned in the XY plane perpendicular to the closest edge of TIM pad 60. Whereas the carbon nanotubes 32 in vertical TIM block 65 are aligned in the ZWX or WZU plane and always perpendicular to all carbon nanotubes 31. In this alternative embodiment, the bi-directional TIM pad 60 displayed in a top down view illustrated in FIGS. 4A and 4B can be easily sectioned and connected together to conduct heat to all four sides of the chip stack as shown, so that the carbon nanotubes 31 conduct heat to the closest edge of the TIM pad 60. In this alternative embodiment, the TIM pad 60 is in a rectangular shape where the area of region A=B=C=D no matter what the W/L ratio of the rectangle. In this alternative embodiment, a chip stack 10 of memory chips is covered. The pattern areas for the chip solder bumps 17 on TIM pad 60 are generally applied after assembling the TIM pad 60. This is to ensure that the area for the chip solder bumps 17 on chips 13 are properly aligned.

Figure 7:
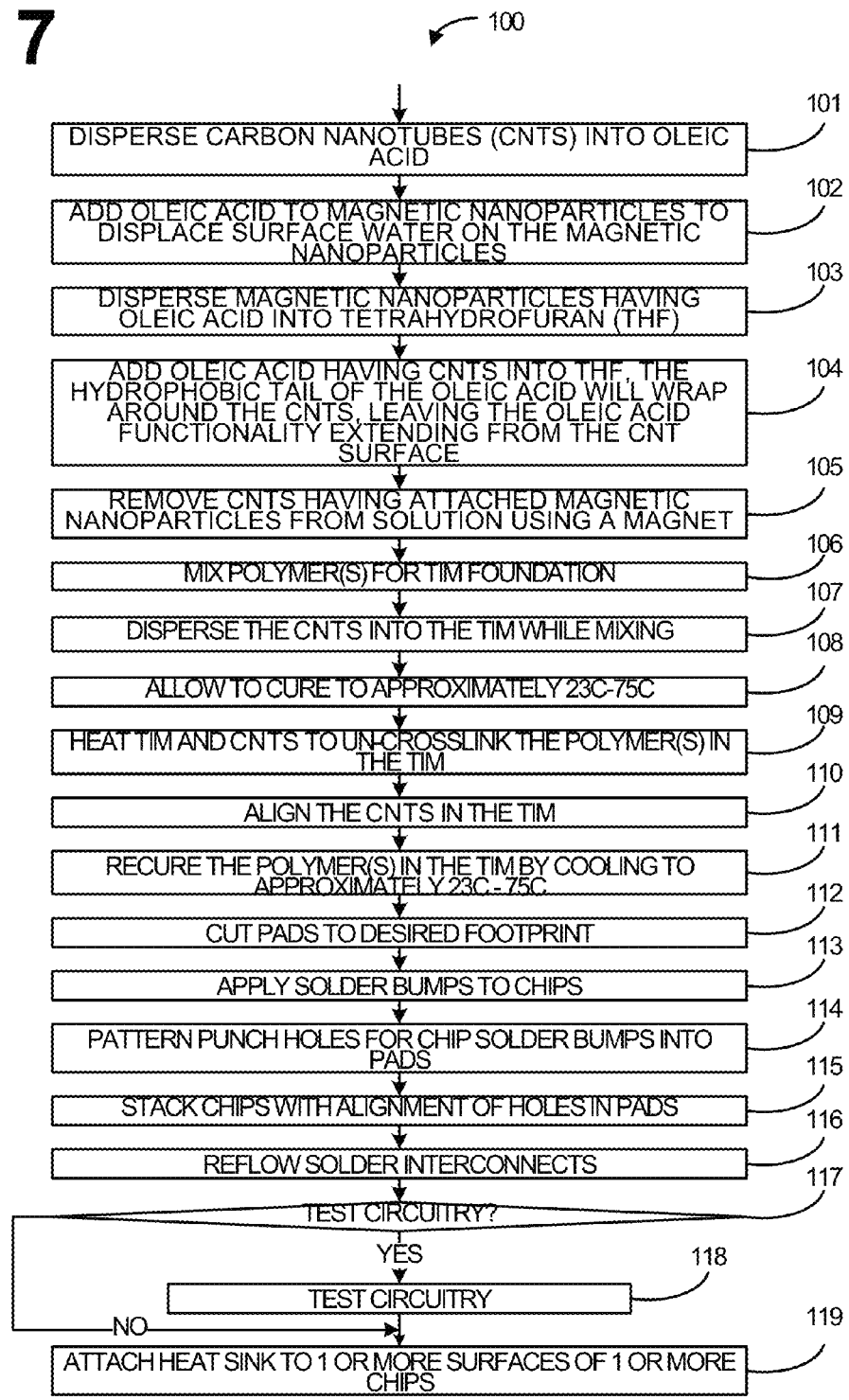
FIG. 7 is a flow chart illustrating an example of a method of forming a silicon device utilizing the thermal interface material with nanotubes containing magnetic nanoparticles that are heated and aligned to orient the conductive axis in the desired direction of the present invention.

FIG. 7 is a flow chart illustrating an example of a method of forming a chip stack 10 utilizing the TIM pad 40 with carbon nanotubes 31 containing magnetic nanoparticles 25, aligned by a magnetic field 38 and heated to orient the conductive axis in the desired direction of the present invention. There are a couple approaches to forming the individual chips 13(A-D), and subsequent assembly, so the following is just one example of a method of constructing silicon devices in a multilayer chip stack 10 utilizing the thermal interface material pad 40 with aligned carbon nanotubes 31.

At step 101, the carbon nanotubes 31 are disbursed into a container 18 containing a solution 27 of oleic acid 23 using well-established methods. In one embodiment, a high-speed dispersive mixer can be utilized. The amount of carbon nanotubes 31 in the solution 27 of oleic acid 23 will typically be in the range of 4 to 10 weight percent based on the amount of solution 27 of oleic acid 23. The carbon nanotubes 31 typically are dispersed essentially homogeneously throughout the solution 27 of oleic acid 23 The oleic acid 23 has a polar, hydrophilic, acid head group 22, and a hydrophobic tail 24. Oleic acid 23 acts as a surfactant and causes the hydrophobic tail 24 to wrap around the carbon nanotube 31. Oleic acid 23, being a long chain (18 carbon atoms) fatty acid, behaves as a surfactant. That is, the long carbon tail is a hydrophobic tail 24, whereas the carboxylic acid head group 22 is hydrophilic. Using the 'like dissolves like' rule, when the carbon nanotubes 31 are dispersed in the solution 27 with oleic acid 23, the hydrophobic tail 24 of oleic acid 23 will wrap around the carbon nanotubes 31 driven by thermodynamics. In an alternative embodiment, carbon nanofibers may be substituted for the carbon nanotubes 31.

At step 102, magnetic nanoparticles 25 are disbursed into a container 19 of solution 28 of oleic acid 23. Exemplary magnetic nanoparticles 25 include, but are not limited to: Magnetite ($Fe_3O_4$), Ferrite ($BaFe_{12}O_{19}$), Metallic nanoparticles with a shell, e.g., CoO layer on the surface of a Co nanoparticle, Maghemite ($Fe_2O_3$, $\gamma$-$Fe_2O_3$), and the like. Upon the addition of oleic acid 23, the hydrophilic acid head 22 of oleic acid 23 will displace the surface water molecules from the magnetic nanoparticles 25.

At step 103, the magnetic nanoparticles 25 with a long carbon chain of attached oleic acid 23 extending off of them, are dispersed into a solution 29 of tetrahydrofuran (THF) in container 21. At step 104, the oleic acid 23 with a hydrophobic tail 24 that wraps around the carbon nanotube 31 leaving the oleic acid 23 functionality extending from the carbon nanotube 31 surface are dispersed into a solution 29 of THF in container 21. The long hydrophobic chains intertwine, the result being magnetic nanoparticles 25 attached to carbon nanotubes 31.

At step 105, a magnet 26 is used to remove the carbon nanotubes 31 having attached magnetic nanoparticles 25 from the THF solution 29 in container 21.

At step 106, at least one thermosetting polymer is added to create the thermal interface material 30 foundation. In one embodiment, the thermal interface material 30 is prepared according to the following procedure. To a 25 mL round bottom flask, aminopropylmethyl-Dimethylsiloxane copolymer (5 g, 0.002 moles APTES) (This polymer is commercially available from Gelest Inc.) is added along with anhydrous tetrahydrofuran (THF), a solvent (15 mL) and a stir bar. To this solution, furfuryl isocyante (0.262 g, 0.002 moles) is added drop wise. The reaction is stirred for 24 hrs at 50 C. THF is removed via distillation to yield the desired furfuryl polydimethylsiloxane (PDMS).

In an alternative embodiment, polymer 2 was prepared according to the following procedure. To a 100 mL round bottom flask, a furan protected maleic anhydride (0.5 g, 0.002 moles) is dissolved in 30 mL of benzene followed by the addition of a magnetic stir bar. To this solution, aminopropylmethyl-dimethylsiloxane copolymer (5 g, 0.002 moles APTES) (This polymer is commercially available from Gelest Inc.) is added drop wise along with benzene (20 mL). This reaction is magnetic mixed for 2 hrs at 80 C. Then $ZnCl_2$ (0.27 g, 0.002 moles) is added and magnetically stirred for 30 min. Then a solution of hexamethyldisilazane (HMDS) (0.48 g, 0.003 moles) and benzene (2.0 mL) is added drop wise and the reaction was brought to reflux and mixed for 1 h. The solution is filtered and washed with 0.5 N HCl to work up. The organic layer is dried with magnesium sulfate and the volatiles removed by distillation.

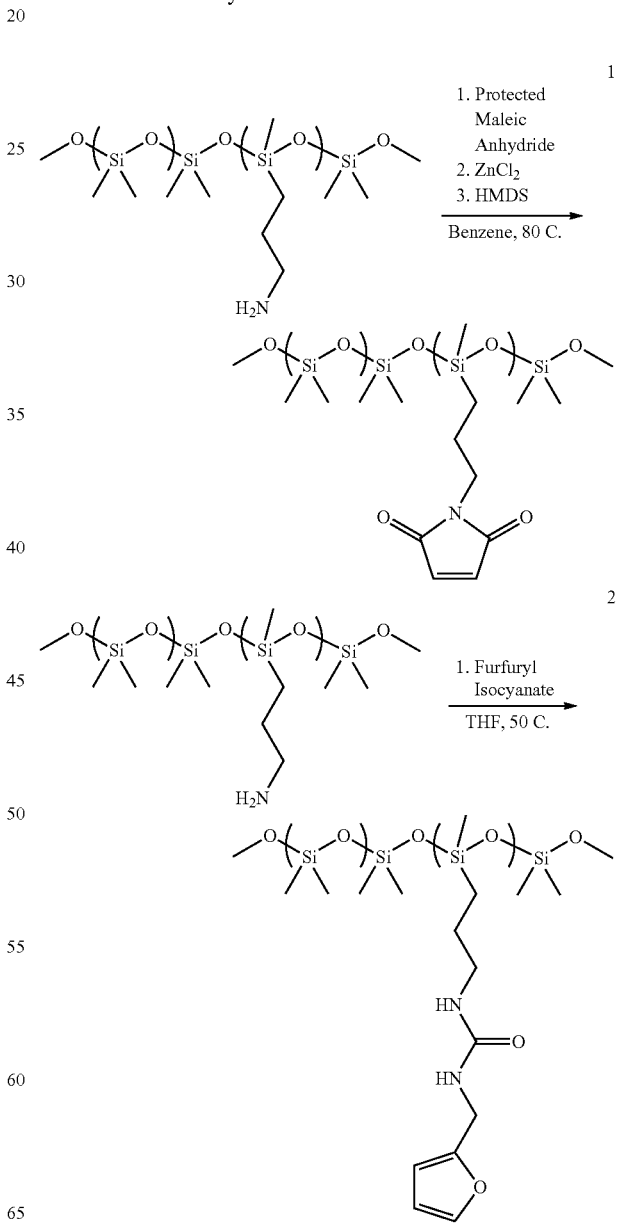

To prepare the TIM formulation, polymer 1 and polymer 2 are to be used at equal weight percents. While mixing polymer 1 and 2 together, the carbon nanotube-like structures can be added and mixed. Once mixed in, it can be applied and allowed to cure from room temperature to 70 C. When ready to align, the temperature is brought to approximately 110 C, at which point the polymer will under go a retro Diels Alder reaction and un-crosslink the polymer, thus reducing the viscosity significantly and allowing for facile alignment via an external field. This will allow for optimal alignment of the carbon nanotube-like 31 structures. Below is an example to demonstrate the retro-Diels Alder reaction.

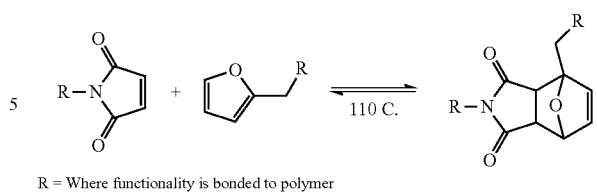

R = Where functionality is bonded to polymer

Below is another example of a TIM formulation, which would allow for rapid viscosity changes to facilitate alignment of the carbon nanotube-like 31 structures.

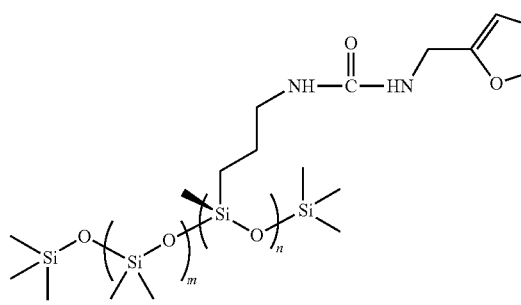

Furan-urea substituted siloxane

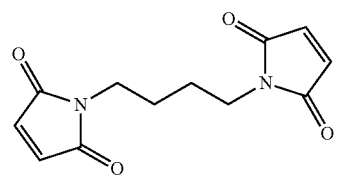

1,4-Di(maleimido)butane

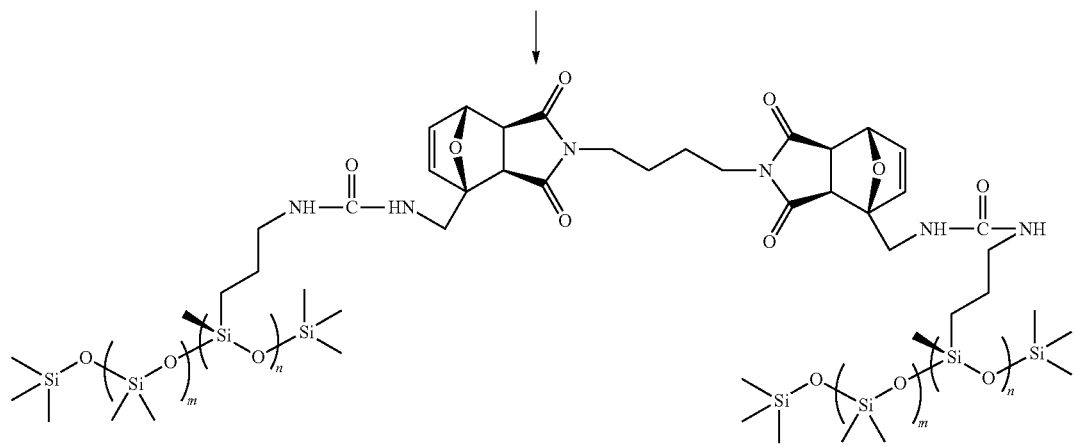

Diels-Alder Adduct
Reversibly Crosslinked Siloxane

Another suitable matrix based on reversible isocyanate reaction with phenol functionality is as follows where the R group can be a wide number of functional groups which will change the reversibility temperature as long as one R group is bound to a polymer to create a TIM formulation:

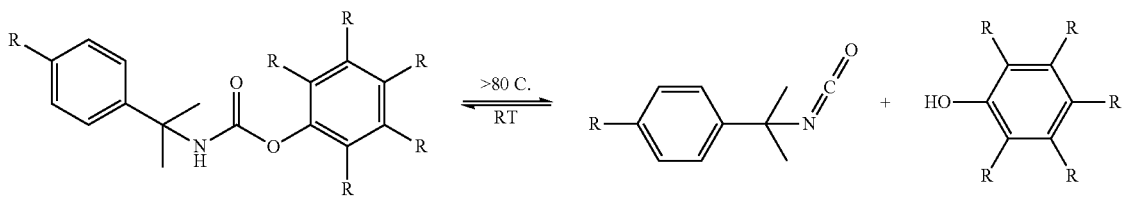

At step 107, the carbon nanotubes 31 having attached magnetic nanoparticles 25 are disbursed into the melt using well-established methods. In one embodiment, a high-speed dispersive mixer can be utilized. The amount of carbon nanotubes 31 in the thermal interface material 30 of the present invention will typically be in the range of 4 to 10 weight percent based on the amount of thermal interface material 30, preferably ~5 weight percent. The carbon nanotubes 31 typically are dispersed essentially homogeneously throughout the bulk of the thermal interface material 30. In an alternative embodiment, carbon nanofibers may be substituted for the carbon nanotubes 31.

At step 108, the thermal interface material 30 with the carbon nanotubes 31 is cooled to approximately 23° C.-75° C. in order to cure. At step 109, the thermal interface material 30 with the carbon nanotubes 31 is heated to a temperature to un-crosslink the polymers in the thermal interface material 30. In the preferred environment, the temperature of the thermal interface material is heated to and maintained at approximately 110° C.-125° C.

At step 110, a magnetic field 38 (FIG. 3B) of sufficient intensity is applied to the thermal interface material 30 containing the carbon nanotubes 31, in order to align the carbon nanotubes 31. In one embodiment, the long axis of the carbon nanotubes 31 are aligned along the conductive axis of the graphite fibers. In another embodiment, the carbon nanotubes 31 are aligned in an orientation perpendicular to the mating surfaces. In still another embodiment, the magnetic field is normally within the range of 500-100,000 Gauss or 0.05-10 Tesla.

At step 111, the thermal interface material 30 containing the carbon nanotubes 31 is cooled to approximately 23° C.-75° C. in order to re-cure the polymers in the thermal interface material 30. At step 112, the TIM pads 40 are cut to the desired footprint. TIM pads 40 of appropriately sized geometry (length X, width Y and thickness Z) are cut from the slab of thermal interface material 30 using conventional techniques known to those skilled in the art. The geometry of TIM pad 40 is dictated by the footprint of the integrated circuit to which the TIM pads 40 will be mated.

At step 113, solder bumps 17 are then formed on the on the bottom surface of the chip 13. These solder bumps 17 are generally in alignment with the electrically conductive channels 16 on chip 13 in order to conduct electrical signals. In an alternative embodiment, thermal conductive channels 15 may conduct heat instead of electronic signals and use a solder bump 17 with thermal conductive ability. In one embodiment, a homogenous process could be used to create solders bump 17 for both electrically conductive channels 16 and any thermal conductive channels 15.

At step 114, areas 41 are placed within the pads 42 corresponding with solder bumps 17 on chips 13. This will allow these solder bumps on chip 13 to extend through TIM pads 40 in order to mechanically and electrically connect another chip 13. At step 115, the chips 13 in the chip stack 10 are assembled with the TIM pads 40 in between two adjacent chips 13.

At step 116, the chip stack 10 is heated to a reflow temperature, at which point the solder in the solder bumps 17 flows. Subsequent cooling results in a fixed, electrically conductive joint to be formed between the electrically conductive channels 16. An example of this is to have the bottom surface of a first chip 13A coupled to a top surface of a second chip 13B with a TIM pad 40A (FIG. 1) in between.

At step 117, it is determined if the circuitry on chips 13 in chip stack 10 are to be tested. If it is determined in step 117 that testing the circuitry in the chip stack 10 is not to be performed, then the method 100 skips to step 119. However, if it is determined at step 114 that the circuitry on chips 13 in chip stack 10 are to be tested, then the circuitry is tested for electrical performance, at step 118.

At step 119, the method 100 attaches a heat sink 11 to one or more surfaces of one or more chips 13.

Figure 8:
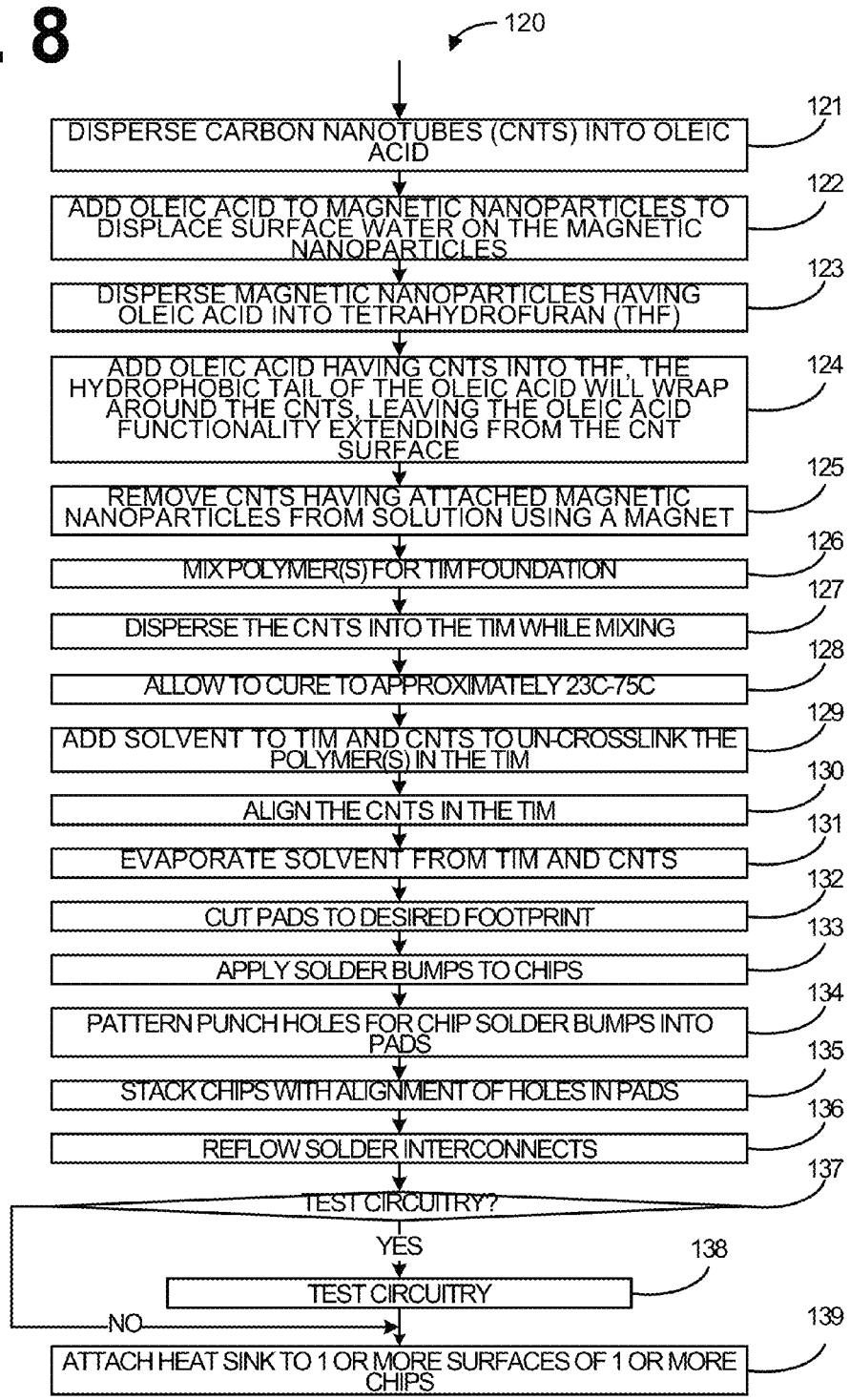
FIG. 8 is a flow chart illustrating an example of a method of forming a silicon device utilizing the thermal interface material with nanotubes containing magnetic nanoparticles that are aligned by using a solvent to orient the conductive axis in the desired direction of the present invention.

FIG. 8 is a flow chart illustrating an example of a method of constructing silicon devices in a multilayer chip stack 10 utilizing the thermal interface material 30 with carbon nanotubes 31 containing magnetic nanoparticles 25, heated and aligned by using a solvent to orient the conductive axis of the carbon nanotubes 31 in the desired direction of the present invention.

At step 121, the carbon nanotubes 31 are disbursed into a container 18 containing a solution 27 of oleic acid 23 using well-established methods. In one embodiment, a high-speed dispersive mixer can be utilized. The amount of carbon nanotubes 31 in the solution 27 of oleic acid 23 will typically be in the range of 4 to 10 weight percent based on the amount of solution 27 of oleic acid 23. The carbon nanotubes 31 typically are dispersed essentially homogeneously throughout the solution 27 of oleic acid 23 The oleic acid 23 has a polar, hydrophilic, acid head group 22, and a hydrophobic tail 24. Oleic acid 23 acts as a surfactant and causes the hydrophobic tail 24 to wrap around the carbon nanotube 31. Oleic acid 23, being a long chain (18 carbon atoms) fatty acid, behaves as a surfactant. That is, the long carbon tail is a hydrophobic tail 24, whereas the carboxylic acid head group 22 is hydrophilic. Using the 'like dissolves like' rule, when the carbon nanotubes 31 are dispersed in the solution 27 with oleic acid 23, the hydrophobic tail 24 of oleic acid 23 will wrap around the carbon nanotubes 31 driven by thermodynamics. In an alternative embodiment, carbon nanofibers may be substituted for the carbon nanotubes 31.

At step 122, magnetic nanoparticles 25 are disbursed into a container 19 of solution 28 of oleic acid 23. Exemplary magnetic nanoparticles 25 include, but are not limited to: Magnetite ($Fe_3O_4$), Ferrite ($BaFe_{12}O_{19}$), Metallic nanoparticles with a shell, e.g., CoO layer on the surface of a Co nanoparticle, Maghemite ($Fe_2O_3$, $\gamma$-$Fe_2O_3$), and the like. Upon the addition of oleic acid 23, the hydrophilic acid head 22 of oleic acid 23 will displace the surface water molecules from the magnetic nanoparticles 25.

At step 123, the magnetic nanoparticles 25 with a long carbon chain of attached oleic acid 23 extending off of them, are dispersed into a solution 29 of tetrahydrofuran (THF) in container 21. At step 124, the oleic acid 23 with a hydrophobic tail 24 that wraps around the carbon nanotube 31 leading the oleic acid 23 functionality extending from the carbon nanotube 31 surface are dispersed into a solution 29 of THF in container 21. The long hydrophobic chains intertwine, the result being magnetic nanoparticles 25 attached to carbon nanotubes 31.

At step 125, a magnet 26 is used to remove the carbon nanotubes 31 having attached magnetic nanoparticles 25 from the THF solution 29 in container 21.

At step 126, at least one thermosetting polymer is added to create the thermal interface material 30 foundation. In one embodiment, the thermal interface material 30 is prepared according to the following procedure. To a 25 mL round bottom flask, aminopropylmethyl-Dimethylsiloxane copolymer (5 g, 0.002 moles APTES) (This polymer is commercially available from Gelest Inc.) is added along with anhydrous THF (15 mL) and a stir bar. To this solution, furfuryl isocyante (0.262 g, 0.002 moles) is added drop wise. The reaction is stirred for 24 hrs at 50 C. THF is removed via distillation to yield the desired furfuryl PDMS.

At step 127, the carbon nanotubes 31 are disbursed into the melt using well-established methods. In one embodiment, a high-speed dispersive mixer can be utilized. The amount of carbon nanotubes 31 in the thermal interface material 30 of the present invention will typically be in the range of 4 to 10 weight percent based on the amount of thermal interface material 30, preferably ~5 weight percent. The carbon nanotubes 31 typically are dispersed essentially homogeneously throughout the bulk of the thermal interface material 30. In an alternative embodiment, carbon nanotubes may be substituted for the carbon nanotubes 31.

At step 128, the thermal interface material 30 with the carbon nanotubes 31 is cooled to approximately 23° C.-75° C. in order to cure. At step 129, a solvent is added to the thermal interface material 30 with the carbon nanotubes 31 to assist in un-crosslinking the polymers in the thermal interface material 30. In the preferred environment, the solvent is THF or other suitable solvent known to those skilled in the art.

At step 130, a magnetic field 38 (FIG. 2B) of sufficient intensity is applied to the thermal interface material 30 containing the carbon nanotubes 31, in order to align the carbon nanotubes 31. In one embodiment, the long axis of the carbon nanotubes 31 are aligned along the conductive axis of the graphite fibers. In another embodiment, the carbon nanotubes 31 are aligned in an orientation perpendicular to the mating surfaces. In still another embodiment, the magnetic field is normally within the range of 500-100,000 Gauss or 0.05-10 Tesla. At step 131, the solvent within the thermal interface material 30 containing the carbon nanotubes 31 is evaporated off. In an alternative embodiment, a vacuum stripping method can be used, where the material is simply subjected to a vacuum. At step 128, the thermal interface material 30 with the carbon nanotubes 31 is cooled to approximately 23° C.-75° C. in order to re-cure the polymers in the thermal interface material.

At step 132, the TIM pads 40 are cut to the desired footprint. TIM pads 40 of appropriately sized geometry (length X, width Y and thickness Z) are cut from the slab of thermal interface material 30 using conventional techniques known to those skilled in the art. The geometry of TIM pad 40 is dictated by the footprint of the integrated circuit to which the TIM pads 40 will be mated.

At step 133, solder bumps 17 are then formed on the bottom surface of the chip 13. These solder bumps 17 are generally in alignment with the electrically conductive channels 16 on chip 13 in order to conduct electrical signals. In an alternative embodiment, thermal conductive channels 15 may conduct heat instead of electronic signals and use a solder bump 17 with thermal conductive ability. In one embodiment, a homogenous process could be used to create solder bumps 17 for both electrically conductive channels 16 and any thermal conductive channels 15.

At step 134, areas 41 are placed within the pads corresponding with solder bumps 17 on chips 13. This will allow these solder bumps on chip 13 to extend through TIM pads 40 in order to mechanically and electrically connect another chip 13. At step 135, the chips 13 in the chip stack 10 are assembled with the TIM pads 40 in between two adjacent chips 13.

At step 136, the chip stack 10 is heated to a reflow temperature, at which point the solder in the solder bumps 17 flows. Subsequent cooling results in a fixed, electrically conductive joint to be formed between the electrically conductive channels 16. An example of this is to have the bottom surface of a first chip 13A coupled to a top surface of a second chip 13B with a TIM pad 40A (FIG. 1) in between.

At step 137, it is determined if the circuitry on chips 13 in chip stack 10 are to be tested. If it is determined in step 136 that testing the circuitry in the chip stack 10 is not to be performed, then the method 120 skips to step 139. However, if it is determined at step 136 that the circuitry on chips 13 in chip stack 10 are to be tested, then the circuitry is tested for electrical performance, at step 138.

At step 139, the method 120 attaches a heat sink 11 to one or more surfaces of one or more chips 13.

The terminology used herein is for describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The flowchart and block diagrams in the Figures illustrate the functionality, and operation of possible implementations of systems and methods according to various embodiments of the present invention. In this regard, each block in the flowchart or block diagrams may represent a module, segment, or task to be performed, which comprises one or more executable steps for implementing the specified function(s). It should also be noted that, in some alternative implementations, the functions noted in the block may occur out of the order noted in the Figures. For example, two blocks shown in succession may in fact be performed substantially concurrently or the blocks may sometimes be executed in the reverse order, depending upon the functionality involved.

It should be emphasized that the above-described embodiments of the present invention, particularly any "preferred" embodiments, are merely possible examples of implementations set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

The invention claimed is:

1. A method for aligning a plurality of nanotubes containing a magnetic material in a thermal interface material to enhance performance of the thermal interface material, comprising:
   attaching the magnetic material to the plurality of nanotubes, wherein the attaching further comprises:
      dispersing the plurality of nanotubes into a first solution containing oleic acid, wherein a hydrophobic tail of the oleic acid wraps around one of the plurality of nanotubes; and
      dispersing the magnetic material into a second solution containing oleic acid, wherein a hydrophilic acid head of the oleic acid attaches to the magnetic material;
   dispersing the plurality of nanotubes containing the magnetic material into the thermal interface material;
   heating the thermal interface material until the at least one thermosetting polymer un-crosslinks; and
   applying a magnetic field of sufficient intensity to align the plurality of nanotubes containing the magnetic material in the thermal interface material; and
   cooling the thermal interface material until the at least one thermosetting polymer re-crosslinks.

2. The method of claim 1, wherein the attaching further comprises:
  dispersing the plurality of nanotubes with the attached hydrophobic tail of the oleic acid wrapped around one of the plurality of nanotubes into a solution of tetrahydrofuran; tetrahydrofuran; and
  dispersing the magnetic material with the attached hydrophilic acid head of the oleic acid into the solution of tetrahydrofuran.

3. The method of claim 2, wherein the hydrophilic acid head of the oleic acid attached to the one of the plurality of nanotubes attaches to the magnetic material and the hydrophobic tail of the oleic acid attached to the magnetic material wraps around one of the plurality of nanotubes.

4. The method of claim 3, wherein the plurality of nanotubes are aligned parallel to mating surfaces of the thermal interface material.

5. The method of claim 3, wherein the plurality of nanotubes are aligned perpendicular to mating surfaces of the thermal interface material.

6. The method of claim 3, comprising:
  cutting the thermal interface material into a thermal interface material pad, and wherein each of the plurality of nanotubes in the thermal interface material pad are arranged so that both ends of each of the plurality of nanotubes are perpendicular to an edge of the thermal interface material pad closest to each of the plurality of nanotubes.

7. The method of claim 6, wherein the thermal interface material pad includes a second plurality of nanotubes perpendicular to the plurality of nanotubes that creates a vertical heat transmission channel parallel to the edges of the thermal interface material pad.

* * * * *